(12) United States Patent
Kim et al.

(10) Patent No.: US 6,838,819 B2
(45) Date of Patent: Jan. 4, 2005

(54) FULL COLOR ORGANIC EL DISPLAY PANEL, MANUFACTURING METHOD THEREOF AND DRIVING CIRCUIT THEREOF

(75) Inventors: Chang Nam Kim, Seoul (KR); Hak Su Kim, Seoul (KR); Jung Bae Kim, Seoul (KR); Myung Seop Kim, Kyonggi-do (KR)

(73) Assignee: LG Electronics Inc., Seoul (KR)

( * ) Notice: Subject to any disclaimer, the term of this patent is extended or adjusted under 35 U.S.C. 154(b) by 297 days.

(21) Appl. No.: 09/882,379

(22) Filed: Jun. 18, 2001

(65) Prior Publication Data

US 2002/0014837 A1 Feb. 7, 2002

(30) Foreign Application Priority Data

Jun. 19, 2000 (KR) .......................................... 2000-33628
Sep. 19, 2000 (KR) .......................................... 2000-54990
Oct. 24, 2000 (KR) .......................................... 2000-62655

(51) Int. Cl.$^7$ ............................. H01J 1/62; H05B 33/00
(52) U.S. Cl. ......................... 313/505; 313/50; 313/494
(58) Field of Search ................................. 313/498, 500, 313/505, 506, 494; 315/169.3, 169.4, 169.1; 345/76, 77, 92, 36, 45

(56) References Cited

U.S. PATENT DOCUMENTS 6,019,654 A * 2/2000 Kim .............................. 445/24
6,366,025 B1 * 4/2002 Yamada ....................... 313/498
6,407,502 B2 * 6/2002 Hidler ......................... 313/505
6,628,067 B2 * 9/2003 Kobayashi et al. ......... 313/494

* cited by examiner

Primary Examiner—Ashok Patel
(74) Attorney, Agent, or Firm—Fleshner & Kim, LLP

(57) ABSTRACT

Disclosed is a full color flat display panel by using an organic electro-luminescent(EL) device, a manufacturing method thereof and a driving circuit of the organic EL device, in particular, which includes first, second and third pixels, a plurality of first electrodes, and a plurality of second electrodes perpendicularly intersecting the first electrodes, in which each of the first, second and third light emitting pixels is arranged in each of intersecting positions of the first and second electrodes. Light emitting pixels are arranged to have different areas according to luminous efficiency so that a red light emitting area with relatively poorer efficiency is sized larger than a blue or green light emitting area thereby manufacturing an efficient full color organic EL display panel. Also, the influence from the line resistance in the anode lines and the cathode lines is reduced when a constant current is introduced into the device structured of the RGB array in order to realize the white light as full color. Thus, the voltage loss on the line resistance is prevented and the area ratio of the device is adjusted to make each of the RGB pixels for generating the white light have the similar value of drive voltage thereby minimizing power loss.

8 Claims, 22 Drawing Sheets

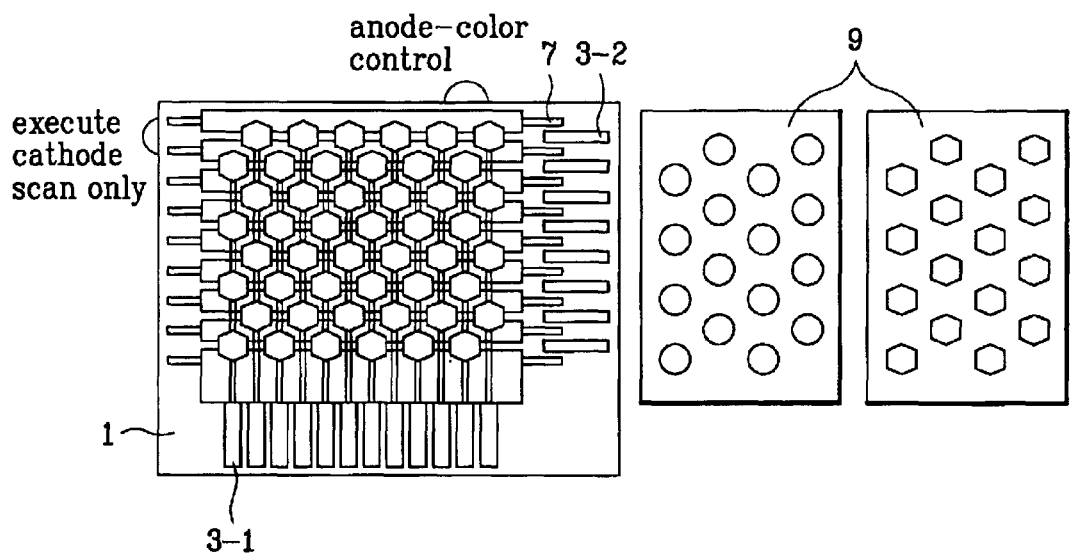
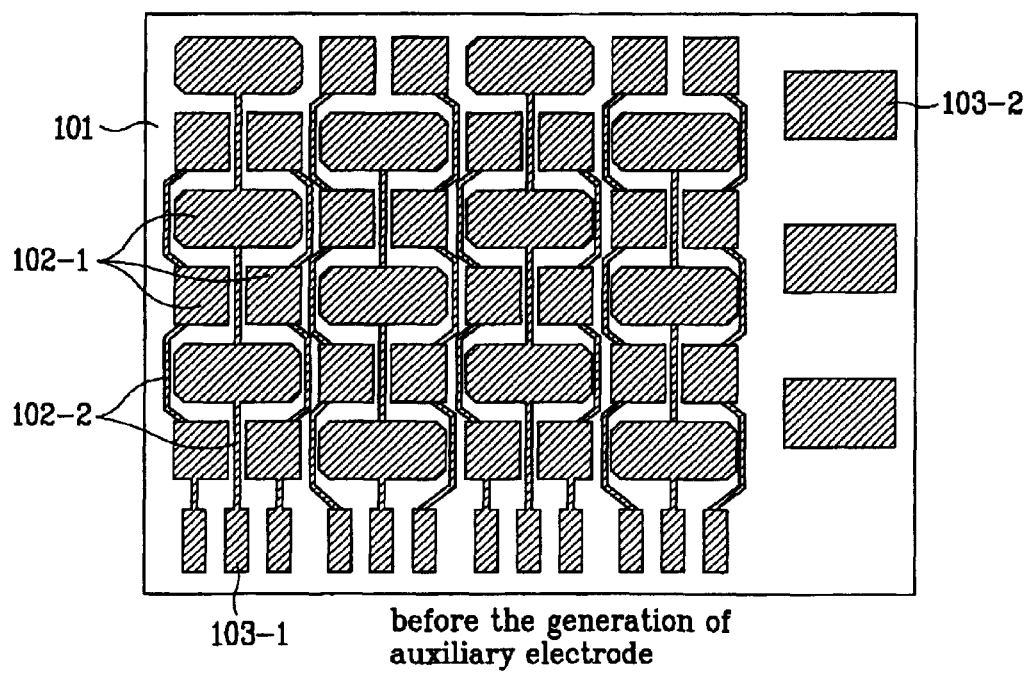

after the generation of auxiliary electrode

FULL COLOR ORGANIC EL DISPLAY PANEL, MANUFACTURING METHOD THEREOF AND DRIVING CIRCUIT THEREOF

BACKGROUND OF THE INVENTION

1. Field of the Invention

The present invention relates to a full color flat display panel by using an organic electro-luminescent(EL) device, a manufacturing method thereof and a driving circuit of the organic EL device.

2. Description of the Related Art

Lately, the flat display industry has been remarkably developed. In particular, an organic EL array is gradually gaining interest as an image source in a direct display or a virtual display since the organic EL array can generate a relatively large amount of light and a display adopting the organic EL array can be used under various surrounding conditions.

In other words, the organic EL array can emit light in a sufficient amount so as to be used as the display under the various surrounding conditions ranging from those with no or little amount of light to those with sufficient amount of light.

Also, the organic EL array can be manufactured in a low price, and variously applied from a very small size of under 1 inch up to a considerably large size of tens of inches.

Further, the organic EL array provides a very wide range of view angle.

An example of the organic EL array as a small sized article is applied to portable electronic articles such as a pager, a cellular phone and a portable phone.

Such an organic EL device is comprised of a first electrode layer, an electron transporting layer, a light emitting layer, a hole transporting layer and a second electrode layer.

Here, light can be emitted in one or both directions of an electrode, and the most efficient EL device has one transparent electrode layer in a light emitting side.

Also, one the most widely used transparent electrodes is made of an indium-tin oxide(ITO), which is deposited on a transparent substrate such as a glass panel.

However, the major problem of the organic EL device is the connection capacitance, which includes the capacitance within the device composed of the material and the electrode and the capacitance from column and line electrodes in an array structure.

In other words, since the EL device is driven by a current unlikely to a liquid crystal display(LCD) which is driven by a voltage, an initially supplied current is used for charging the connection capacitance when the organic EL device is driven in the array structure.

Therefore, if the connection capacitance increases as the array increases or the device is enlarged, a larger amount of current should be supplied for the initial charge.

Also, the resistance of an anode line and a cathode line in the array structure gives a very important influence not only to response features of the device but also to the whole power.

In other words, a time for charging the capacitance or an RC time is influenced not only from the size of the capacitance but also to the resistance connected to the capacitance so that the response speed of the device is considerably influenced also as the resistance size of anode and cathode lines increases.

Further, the transparent electrode layer is made of a high resistive material thereby increasing such a problem.

Therefore, the connection capacitance and the electrode layer having high resistance of the organic EL device hinder producing the EL device in a large array structure.

In order to reduce such an influence, the anode and cathode lines can be made of a metal excellent in conductivity and low in resistance to reduce the line resistance in the anode and cathode lines thereby improving the response features of the device and simultaneously to reduce the voltage loss in the line resistance thereby lowering a drive voltage and reducing power consumption.

However, in a delta shaped array structure, such line resistance can be a more serious obstacle due to the fine cathode line. In other words, in a full color device structure, the voltage and current ratio among R, G and B pixels is 3:6:1 for expressing a white light. Therefore, the G(Green) pixel requires a smaller amount of voltage and current than the B(Blue) pixel in expressing the same value of luminance.

FIG. 1 shows a structure of RGB stripe-type pixels, and the current and voltage features in a, a' and a" positions of an A material which composes one of the RGB pixels and b, b' and b" positions of another B material which composes another one of the RGB pixels.

As can be seen in FIG. 1, the RGB pixels have their own physical properties different from one another so that the current-voltage features may be different in this case.

Referring to FIG. 1, the current-voltage features of the B material is better than those of the A material.

As an example, the A material can be regarded as the R(Red) pixel, and the B material can be regarded as the G or B pixel.

This can be varied according to the properties of materials, in which the A material can be regarded as having the poorest properties.

Also, referring the current-voltage features of each material, if the device has an array structure, there is a difference in the voltage-current features as in a, a' and a' and a" even in the same material due to the effect of line resistance observed along the anode line and along the cathode line.

The properties of the material like this increase the voltage applied to the line resistance of the anode and the cathode such as b, b' and b" and a, a' and a" to cause the increase of the drive voltage.

In particular, in the case of the A material (for the R pixels for example) which is poor in the current-voltage features, a higher current is required to obtain the white light thereby causing a voltage drop due to line resistance to be more serious.

Here, if the RGB pixels do not have their own power, the driver power should be determined according to a material having the poorest current-voltage features so that the drive voltage in another material having better current-voltage features is elevated thereby incurring overall power loss.

In driving the circuit in practice, the drive voltage is determined according to the pixel having the highest voltage. If the G light emitting pixels are assumed to have the luminance v. current features at least two times better than the R pixels, the drive voltage should be determined by the R pixel so that the drive voltage of the R pixels increases in respect to the G pixels thereby incurring power loss.

As a method of solving this case, the drive voltage is determined different for each of the RGB pixels to reduce power consumption.

However, when each of the RGB pixels is applied with a different voltage from one another, a reverse voltage should be applied to prevent crosstalk according to the features of the organic EL device. Here, the reverse voltage should be applied so that a positive voltage applied to the device does not exceed the threshold voltage.

Therefore, since the reverse voltage is applied according to the drive voltage of the R light emitting pixels if the R light emitting pixels have the highest drive voltage, the higher reverse voltage should be applied as the drive voltage of the R light emitting pixels is stepped up. So, many problems are caused in using the reverse voltage.

Meanwhile, FIG. 2A is a sectional view of the full color organic EL display device driven by the driving circuit of FIG. 1.

In manufacturing the organic EL display device, a shadow mask is used to form the RGB light emitting pixels having the optimal luminous efficiency as shown in FIG. 2A.

Also, the shadow mask as above is also used in a line method as shown in FIG. 2B, and in a method of arranging the pixels into a delta shape as shown in FIG. 2C.

In other words, as shown in FIG. 2A, anode lines 2—2 (only one is shown) are formed on a glass 1, and partitions 7 are formed before forming cathode lines in the organic EL display device. Then, red, green and blue emitting material layers 8-1, 8-2 and 8-3 are formed by using a shadow mask 9 followed by forming cathodes 10 for forming cathode lines in the front surface.

However, a cell array structure of the full color organic EL device of the related art described hereinbefore has the following problems:

In arranging the pixels according to the line method or the delta shape, the RGB light emitting pixels are sized almost the same so that the R pixel relatively poor in luminance and luminous efficiency is not properly expressed thereby degrading the texture.

Also, the opening ratio is lowered and ITO lines for connecting the light emitting pixels are thinned and elongated to increase resistance so that the uniformity across the screen is degraded and the drive voltage is elevated.

SUMMARY OF THE INVENTION

The present invention has been proposed to solve the foregoing problems of the related art, and it is therefore an object of the invention to provide a full color organic EL display panel and a manufacturing method thereof, in which, for the compensation of the low luminance of red, a red light emitting area is enlarged to upgrade the texture and elevate the opening ratio for increasing the efficiency of the device.

It is another object of the invention to provide a full color EL display panel and a manufacturing method in which a shadow mask used for depositing red, green and blue organic EL layers can be used in common.

It is still another object of the invention to provide a full color EL display panel and a manufacturing method in which auxiliary electrodes are provided in a certain area of anode lines to reduce resistance thereby increasing the uniformity across a screen and lowering the drive voltage of the device.

It is further another object of the invention to provide a driving circuit of an organic EL device which can minimize the driving power of the organic EL device while improving response features of the organic EL device driven by using a current source.

It is other object of the invention to provide a driving circuit of an organic EL device having an RGB array structure which rapidly controls the response features of the organic EL device by reducing effects of the line resistance in anode lines and cathode lines, adjusts the area ratio of the organic EL device to make the drive voltage of each of the RGB pixels similar to one another, and reduces the drive voltage to minimize power loss when constant current is applied to the organic EL device for realizing a white light.

According to an embodiment of the invention to obtain the foregoing objects, it is provided a full color organic EL display panel comprising: first, second and third pixels; a plurality of first electrodes; and a plurality of second electrodes perpendicularly intersecting the first electrodes; wherein each of the first, second and third light emitting pixels is arranged in each of intersecting positions of the first and second electrodes; wherein each of the first, second and third light emitting pixels has the area different from one another according to luminous efficiency.

It is preferred that each of the first light emitting pixels is arranged colinearly with each of the second light emitting pixels; wherein each of the third light emitting pixels is arranged between each of the first and second light emitting pixels to alternate with each of the first and second light emitting pixels.

The full color organic EL display panel further comprises auxiliary electrodes arranged at least around the first, second and third light emitting pixels and in portions of the first electrodes.

The full color organic EL display panel further comprises insulating layers, wherein each of the auxiliary electrodes is arranged at least one of around each of the first, second and third light emitting pixels and a central portion of each of the third light emitting pixel.

The full color organic EL display panel further comprises partitions arranged among the second electrodes for electrically insulating the second electrodes.

The full color organic EL display panel further comprises encapsulating plates for encapsulating organic EL layers arranged on the first, second and third light emitting pixels; and an encapsulating material for bonding the encapsulating plates to a substrate in non-light emitting areas.

It is preferred that the first electrodes have zigzag-shaped electrodes having partitions inclined at a certain angle for connecting between each of the first light emitting pixels and each of the second light emitting pixels, and stripe shaped electrodes for connecting between each of the third light emitting pixel.

It is also preferred that the partitions are arranged so as not to overlap with corner portions of the third light emitting pixels.

Also, it is preferred that the third light emitting pixels have the area larger than that of the first or second light emitting pixels.

Preferably, the first, second and third light emitting pixels have quadrangular structures which are the same or different from one another.

Preferably also, the first, second and third light emitting pixels are arranged into a delta structure.

Also preferably, the first electrodes are transparent; and wherein the second electrodes are made of metal.

According to another embodiment of the invention to obtain the foregoing objects, it is provided a method of manufacturing a full color organic EL display panel which includes first, second and third pixels, a plurality of first electrodes, and a plurality of second electrodes perpendicularly intersecting the first electrodes, in which each of the first, second and third light emitting pixels is arranged in each of intersecting positions of the first and second electrodes, the method comprising the following steps of: (a) forming the first electrodes on a substrate, wherein the first electrodes include stripe-shaped electrodes for connecting between each of the third light emitting pixels, and zigzag-shaped electrodes having partitions inclined at a certain angle for connecting between each of the first light emitting pixels and each of the second light emitting pixels; (b) forming insulation partitions in areas excepting the light emitting pixels perpendicular to the first electrodes to insulate the first, second and third light emitting pixels; (c) forming organic EL layers on the first, second and third light emitting pixels for emitting lights corresponding to the light emitting pixels respectively; and (d) depositing an electrode material on the whole surface including the organic EL layers to form a plurality of second electrodes.

According to further another embodiment of the invention to obtain the foregoing objects, it is provided a full color organic EL display panel comprising: a unit light emitting pixel having first, second and third pixels; a plurality of first electrodes; and a plurality of second electrodes perpendicularly intersecting the first electrodes; wherein each of the first, second and third light emitting pixels is arranged in each of intersecting positions of the first and second electrodes; wherein the unit light emitting pixel has sub-pixels divided along diagonal directions; and wherein each of the first, second and third light emitting pixels is arranged in each of the sub-pixels with an area different from one another according to the luminous efficiency of each of the first, second and third light emitting pixels.

It is preferred that the first light emitting pixel is positioned in a pair of the sub-pixels opposed along one diagonal direction; and wherein each of the second and third light emitting pixels is positioned in another pair of the sub-pixels opposed along another diagonal direction.

It is also preferred that the first light emitting pixel has the luminous efficiency lower than that of the second and third light emitting pixels.

Preferably, each of the first electrodes is formed under each of the first, second and third light emitting pixels and each of connected portions of the first, second and third light emitting pixels.

The full color organic EL display panel further comprises auxiliary electrodes formed on the first electrodes at the connected portions.

The full color organic EL display panel further comprises auxiliary electrodes formed in edge portions of the first, second and third light emitting pixels.

The full color organic EL display panel further comprises insulation layers formed in non-light emitting areas around the first, second and third light emitting pixels.

Also, the full color organic EL display panel further comprises insulation partitions formed among the second electrodes for electrically insulating the second electrodes.

It is preferred that the first electrodes are transparent lower electrodes; and wherein the second electrodes are upper electrodes made of metal.

According to still another embodiment of the invention to obtain the foregoing objects, it is provided a method of manufacturing a full color organic EL display panel which includes unit light emitting pixels having first, second and third pixels, a plurality of first electrodes, and a plurality of second electrodes perpendicularly intersecting the first electrodes, in which each of the first, second and third light emitting pixels is arranged in each of intersecting positions of the first and second electrodes, the method comprising the following steps of: (a) forming first electrodes on a substrate in a repeated pattern having a certain polygonal shape connected to stripe shape; (b) forming insulation partitions among the unit light emitting pixels adjacent to the first electrodes in the perpendicular direction; (c) forming organic EL layers on the first, second and third light emitting pixels for emitting lights corresponding to the first, second and third light emitting pixels respectively; and (d) depositing an electrode material on the whole surface including the organic EL layers to form a plurality of second electrodes.

According to other embodiment of the invention to obtain the foregoing objects, it is provided a driving circuit of a display device having anode and cathode lines, comprising: an anode circuit for outputting a different drive voltage for each of RGB light emitting pixels so as to correspond to the drive voltage varying according to the line resistance and the material features of the anode lines and the cathode lines; a cathode circuit connected to both ends of the cathode lines for outputting the same signals; and a display unit where the area ratio of each of the RGB light emitting pixels and the width of the anode lines are adjusted according to the features of the applied drive voltage.

It is preferred that the cathode circuit is arranged at the both sides of the cathode lines for applying the same signals to the display unit.

According to the invention, the light emitting pixels are composed into an array structure in which red, green and blue pixels have different areas according to luminous efficiency so that the luminous efficiency of the red pixel relatively poor in luminance and luminance efficiency can be enhanced.

BRIEF DESCRIPTION OF THE DRAWINGS

The above and other objects, features and other advantages of the present invention will be more clearly understood from the following detailed description taken in conjunction with the accompanying drawings, in which

FIG. 2C is a plan view for showing a structure of an organic display device by using a method of arranging pixels into a delta shape of the related art;

FIG. 3A to FIG. 3K are plan views for showing a process of manufacturing a full color EL display device according to the first embodiment of the invention;

DETAILED DESCRIPTION OF THE PREFERRED EMBODIMENT

Preferred embodiments of a full color organic EL display panel according to the invention will be described in reference to the appended drawings as follows:

The full color organic EL display panel and a manufacturing method thereof of the invention will be described as divided in the first, the second and the third embodiments, and a driving circuit for the organic EL display device will be described in the third embodiment.

First Embodiment

FIG. 3A to FIG. 3K are plan views for showing a process of manufacturing a full color EL display device according to the first embodiment of the invention.

As shown in FIG. 3A, a pattern of anode lines 102-2 is formed on a glass 101 by using ITO or other transparent electrodes. Here, light emitting pixels 102-1 are formed into the shape of a polygon with at least three angles, and have the area for emitting a red light larger than that for emitting blue and green lights. Half of the area of the light emitting pixels 102-1 is arranged for red, and the other area is arranged for blue and green. Another pattern of anode lines is also formed under light emitting pixels 102-1.

Figure 3B:
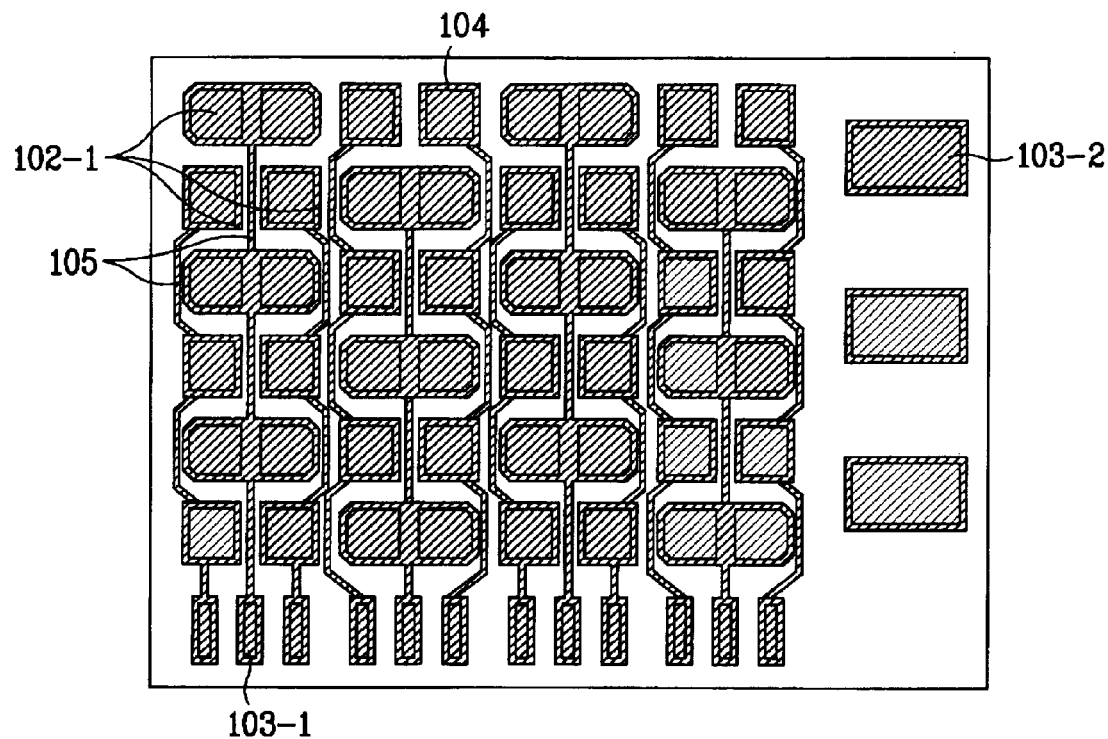

Then, as shown in FIG. 3B, auxiliary electrodes 105 are formed in anode lines 102-2 which connect the light emitting pixels 102-1, in order to reduce the resistance of the anode lines 102-2. When the auxiliary electrodes 104 are provided around the light emitting pixels 102-1 also, the resistance can be further reduced than provided only in the anode lines 102-2.

Figure 4:
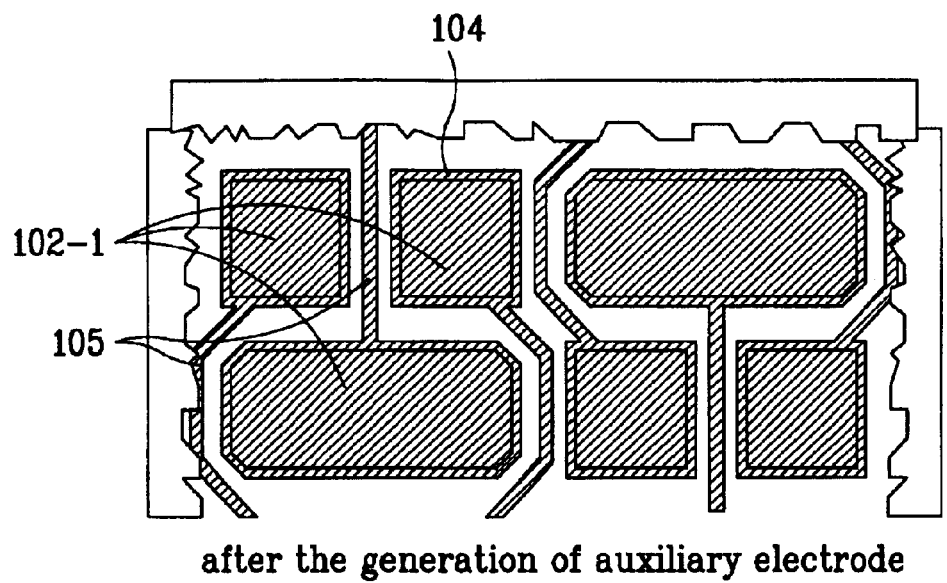
FIG. 4 is a magnification of FIG. 3B.

FIG. 4 is a partial magnification of FIG. 3B, in which it can be seen that the auxiliary electrodes 104 and 105 are formed both around the light emitting pixels 102-1 and in the anode lines 102-2 for connecting the light emitting pixels 102-1. Here, a material used for the auxiliary electrodes 104 and 105 includes a metal such as Cr, Al, Cu, W, Au, Ni, Ag and the like which has relatively smaller resistance than ITO.

Figure 3C:
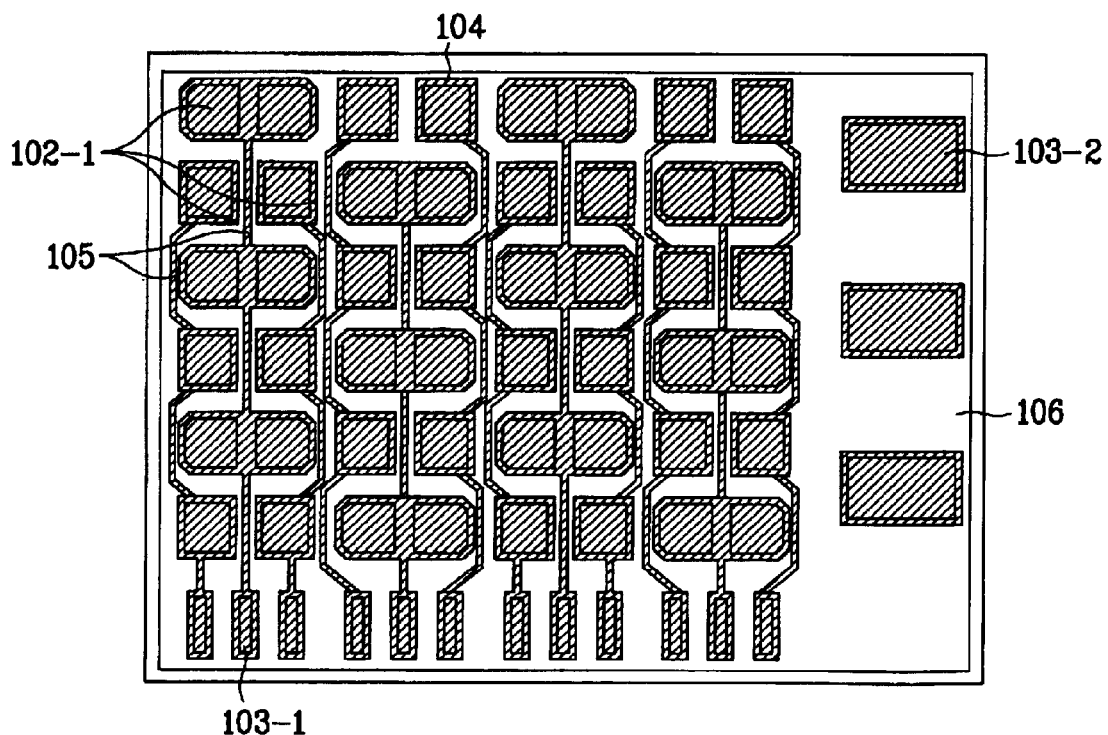

Then, an insulating layer 106 is formed as shown in FIG. 3C. Here, the insulating layer 106 is made of an organic or inorganic insulator. The inorganic insulator includes oxide, nitride. Also, those spinably molten to solvents are available also. Polymers are preferred for the organic substance, and photo-resist, polyimide and polyolenfin are more preferred.

Figure 3D:
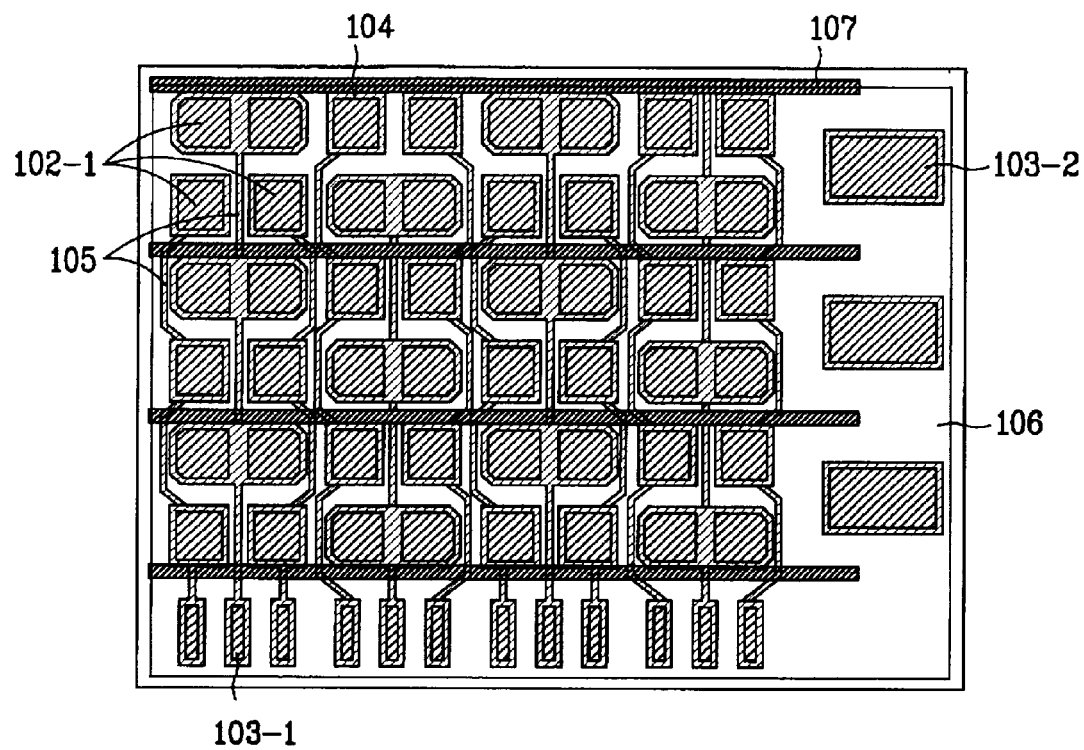

Then, as shown in FIG. 3D, partitions 107 are formed for the insulation among cathodes which will be formed later.

Figure 3E:
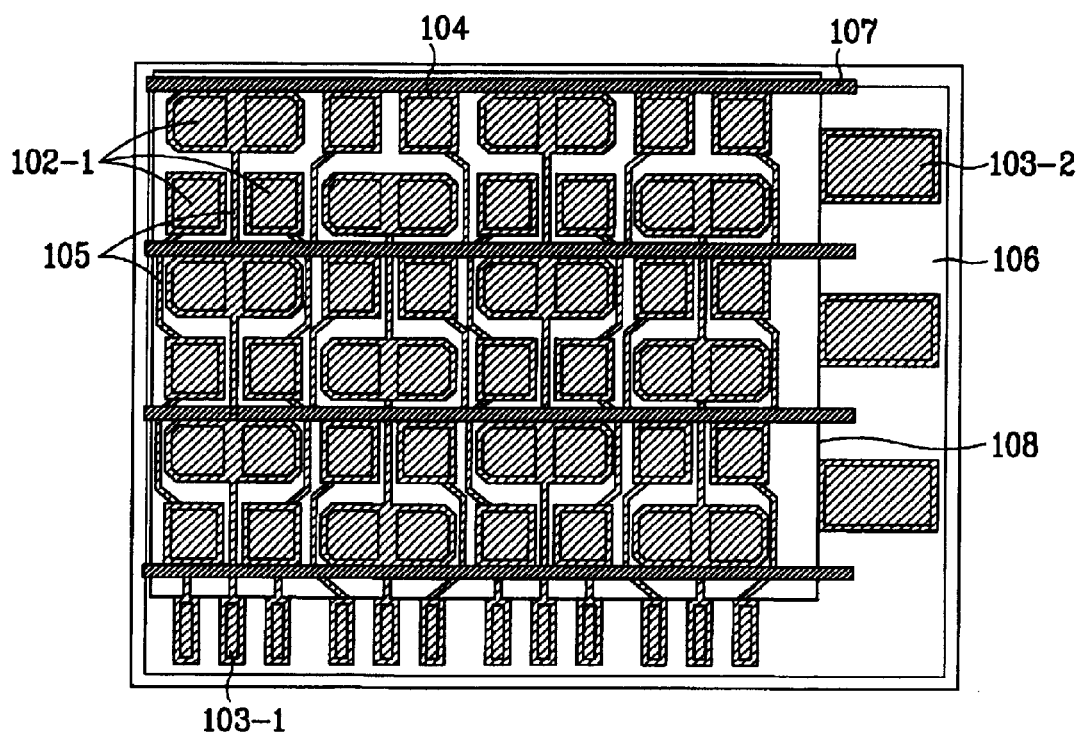

In sequence, as shown in FIG. 3E, red, green and blue common organic EL layers or common organic EL layers 108 are deposited at a single time by using a blank mask capable of performing deposition on the whole light emitting area.

Figure 3F:
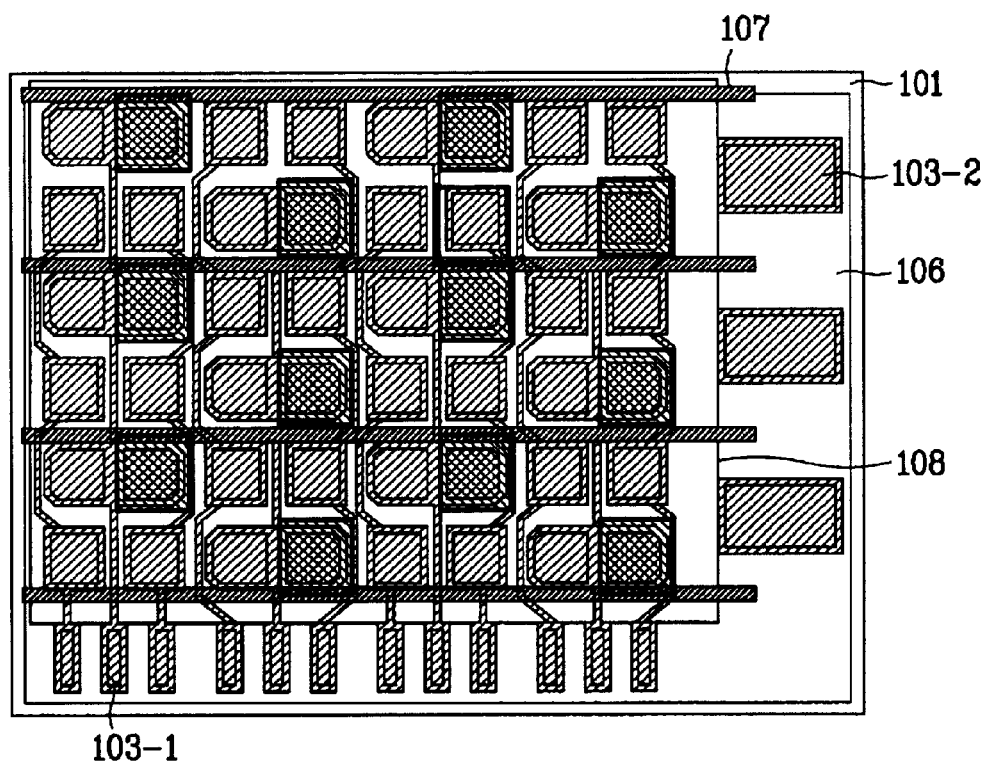
Figure 3G:
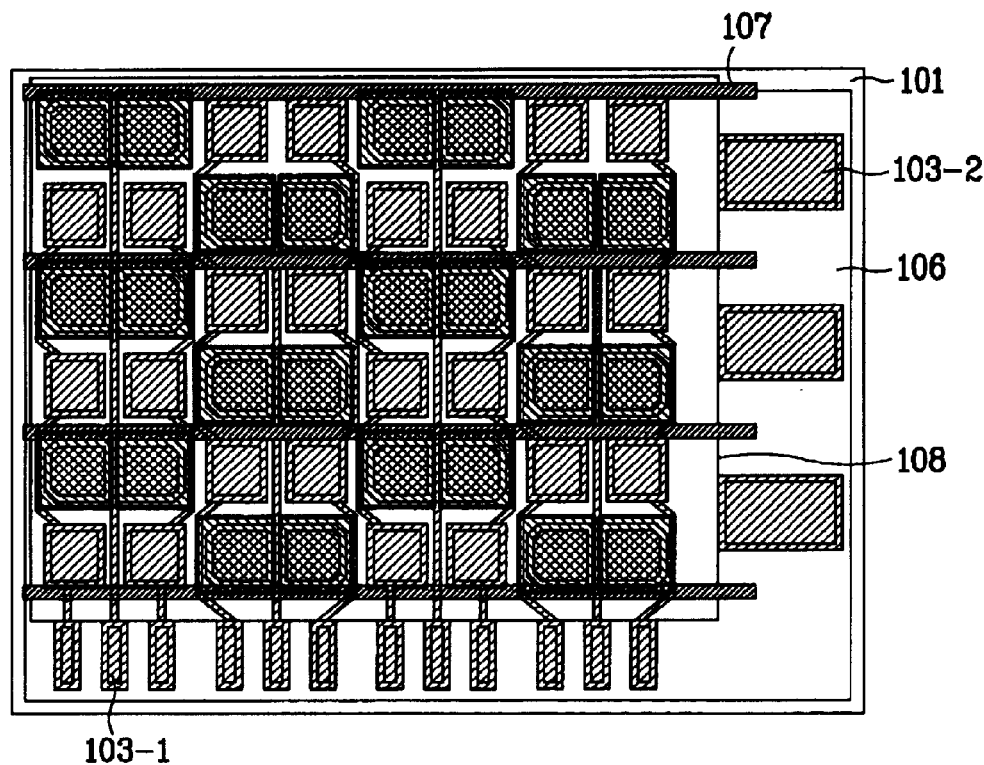
Figure 3H:
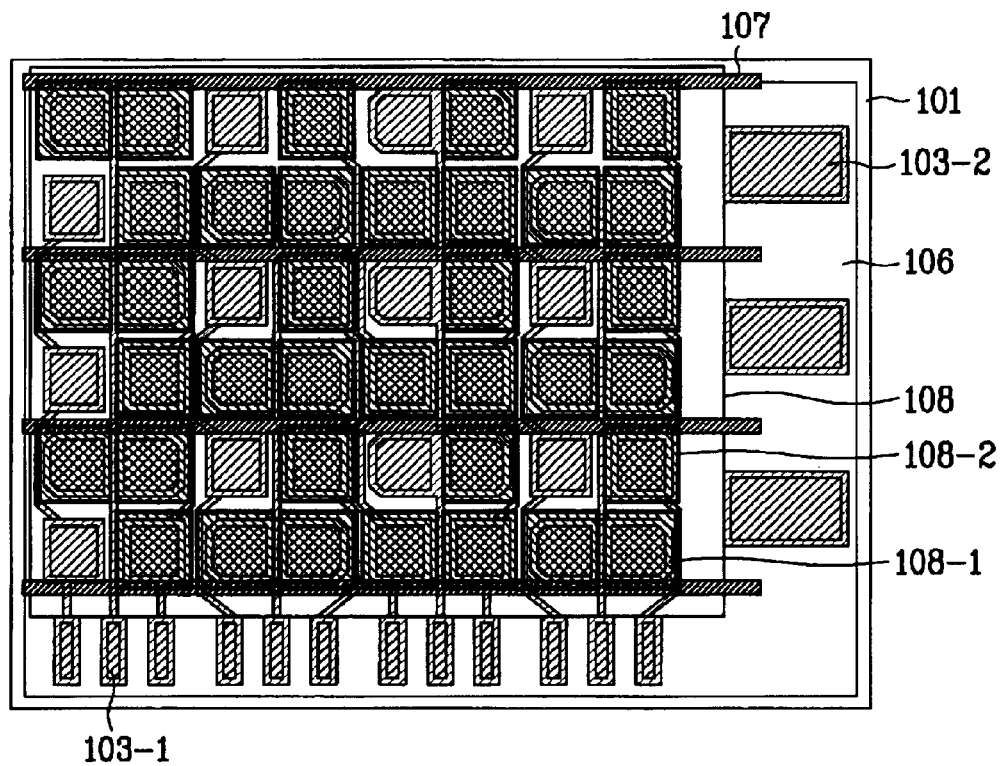
Figure 3I:
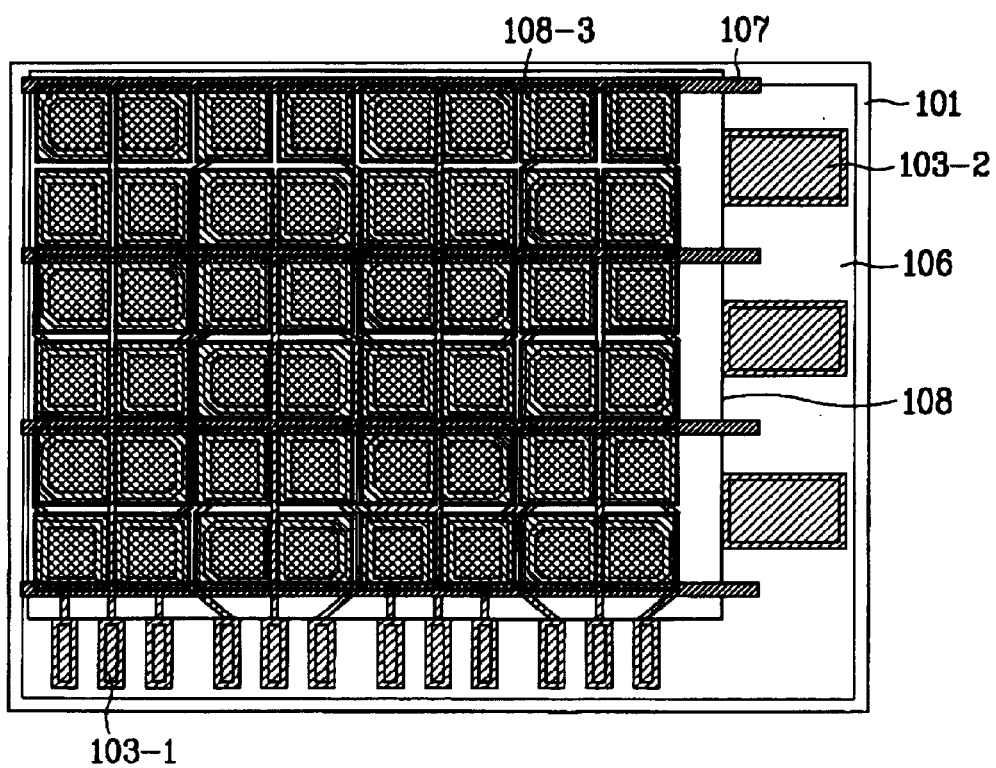
Figure 5:
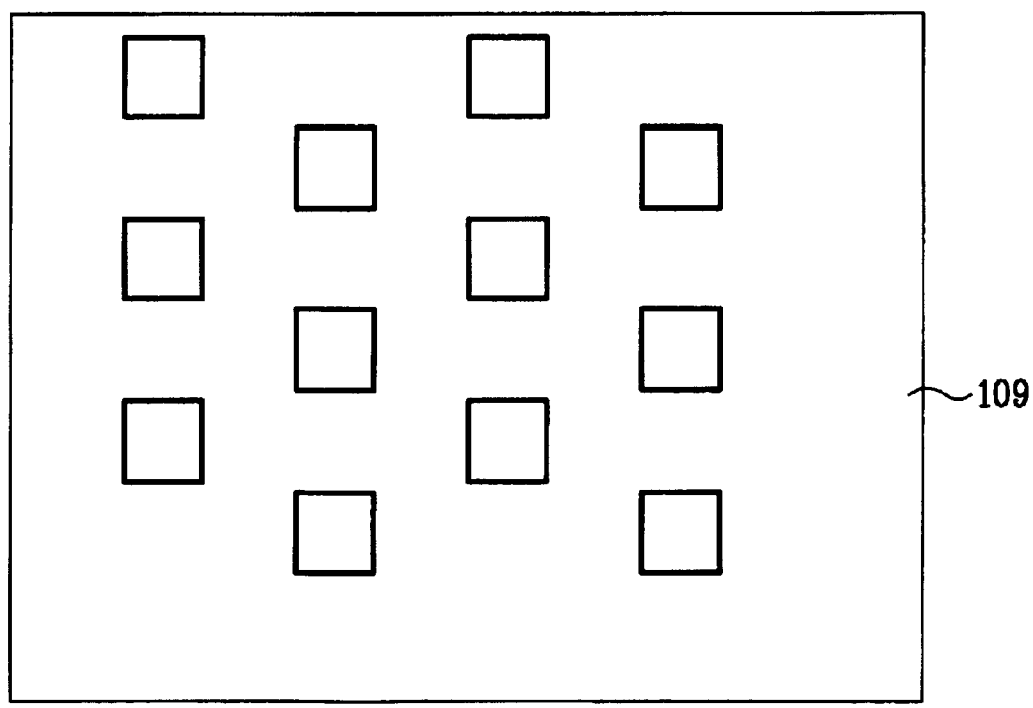
FIG. 5 is a plan view for showing a shadow mask according to the first embodiment of the invention.

Then, a shadow mask 109 shown in FIG. 5 is used to deposit red light emitting material layers 108-1 which are organic EL layers for emitting the red lights as shown in FIG. 3F and FIG. 3G. Also, in the same manner as in the red light emitting material layers, the shadow mask 109 is used to deposit green and blue light emitting material layers 108-2 and 108-3 for generating green and blue lights shown in FIG. 3H and FIG. 3I.

Here, instead of depositing the common organic EL layers 108 in the whole light emitting area, the common organic EL layers 108 can be formed in each of the RGB pixels by using the single shadow mask 109 shown in FIG. 5 while moving the same.

Figure 3J:
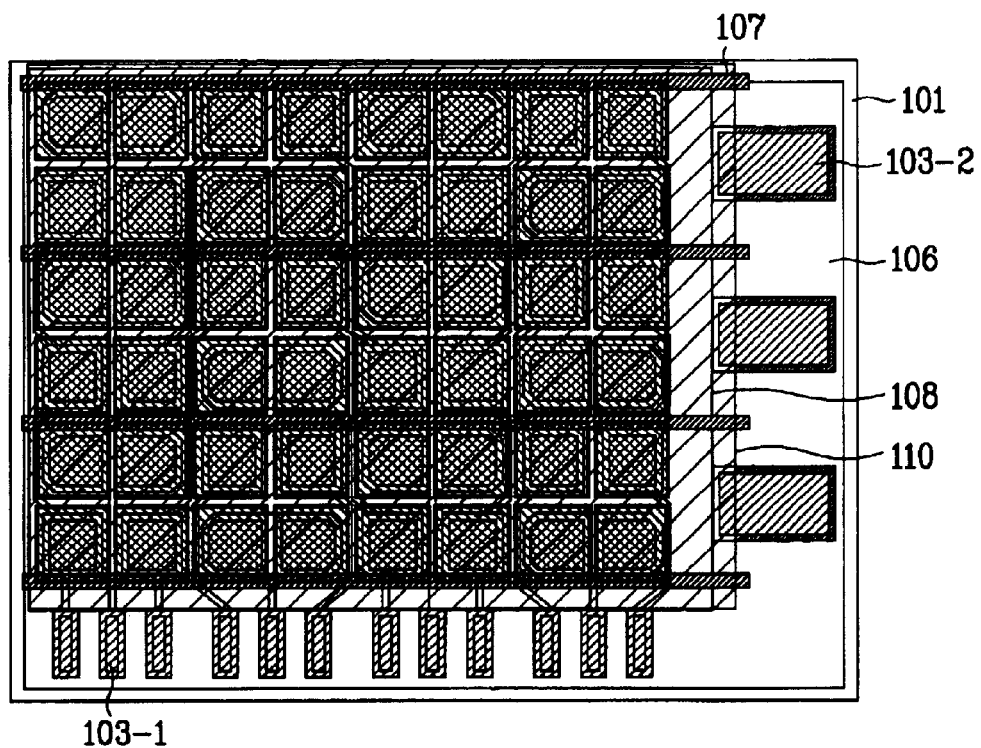

Then, as shown in FIG. 3J a metal layer for forming the cathode 110 is formed by using a Mg—Ag alloy, Al or other conductive materials.

Figure 3K:
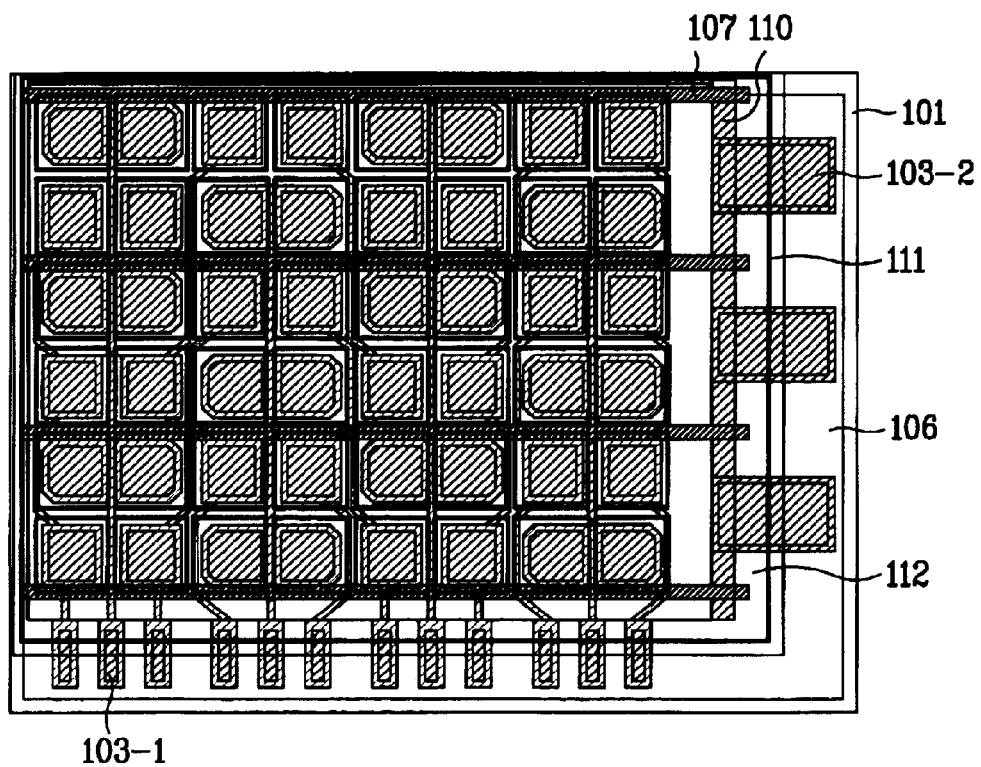

Then, as shown in FIG. 3K, a protective layer such as an oxygen absorbing layer, a moisture absorbing layer and a moisture proof layer is formed, and encapsulation is performed by using encapsulating materials 111 and encapsulating plates 112 to complete the device.

Figure 6A:
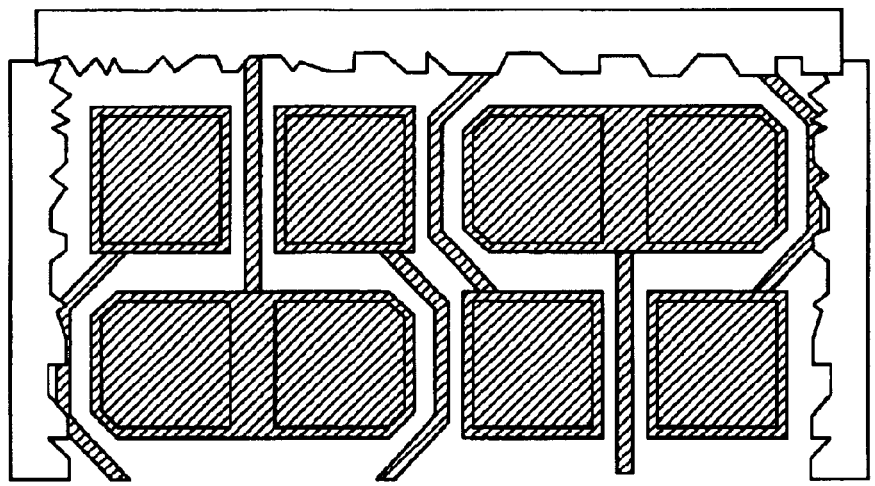
FIG. 6A and FIG. 6B are plan views for showing a completed fill color organic EL display device according to the first embodiment of the invention.
Figure 6B:
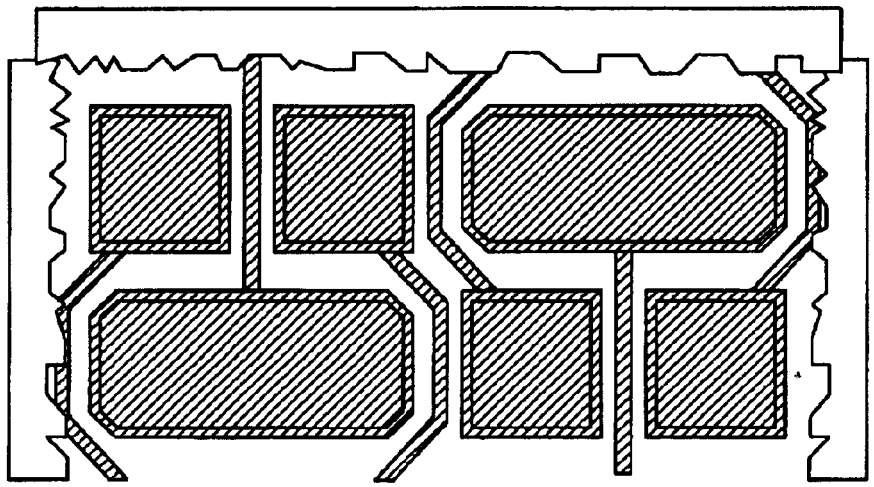

FIG. 6A and FIG. 6B are plan views for showing the completed device.

Positions for the deposition of red, green and blue can be located to have a triangular structure and a reverse triangular structure as shown in FIG. 6A and FIG. 6B.

Here, in the formation of red, green and blue by using the single shadow mask 109, the red light emitting pixels 102-1 are halved by using the insulating layer 106. When a red-dedicated shadow mask 109 is used, the light emitting pixels are formed without being halved as shown in FIG. 6B.

Figure 7:
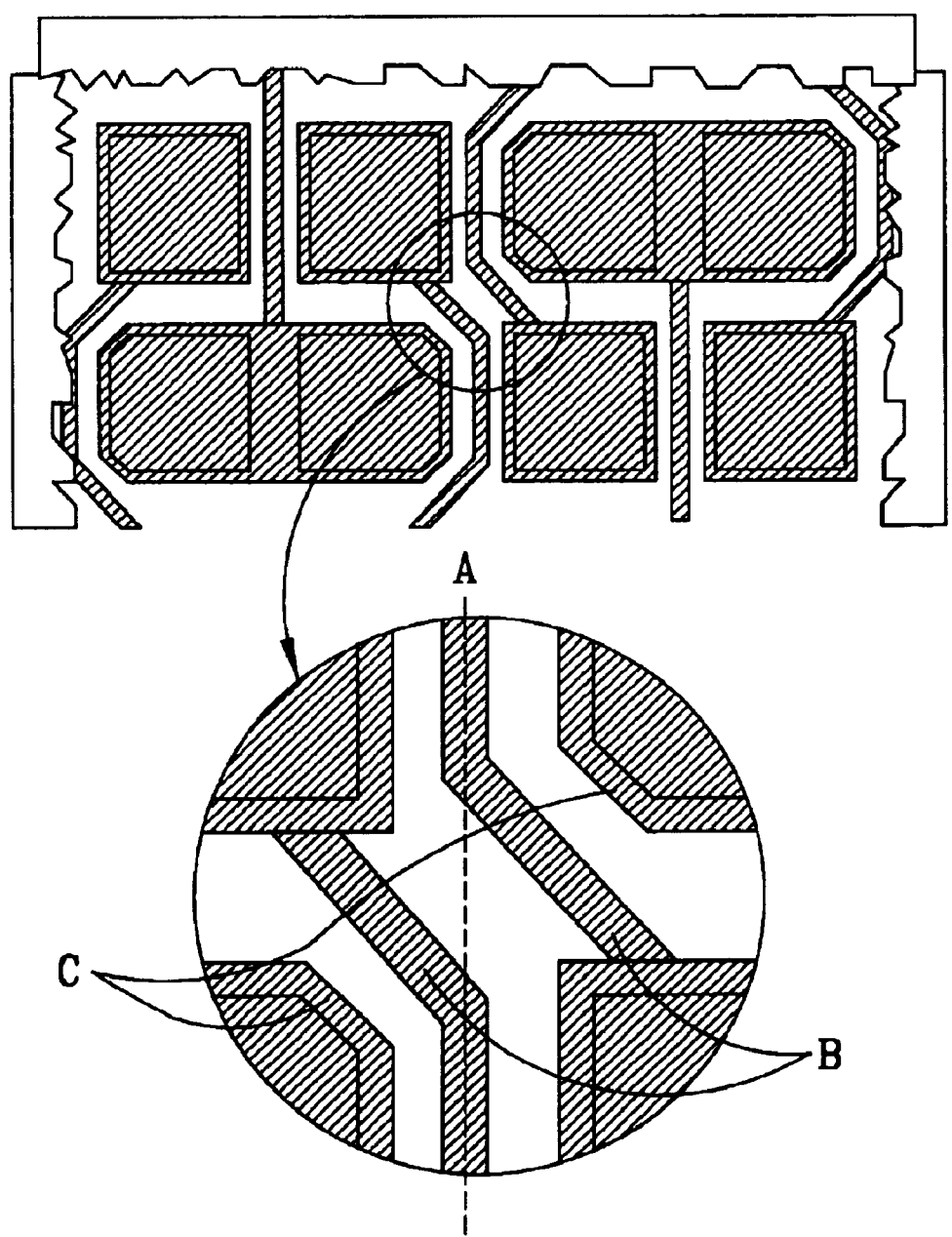
FIG. 7 is a plan view for showing a connection structure of anode lines for connecting between light emitting pixels.

FIG. 7 is a magnification of the anode lines 102-2 for connecting between the green light emitting pixels 102-1 and the blue light emitting pixels 102-1, and the light emitting pixels 102-1 of the anode lines 102-2 for connecting between the red light emitting pixels 102-1 for showing the minimization of the area of the light emitting pixels 102-1.

Basically, the anode lines 102-2 for connecting between each of the green light emitting pixels 102-1 and each of the blue light emitting pixels 102-1 should be formed on a straight line A, formed as inclined as in B in portions where two anode lines 102-2 overlap with each other, and formed as inclined as in C also in corners of the red light emitting pixels 102-1 formed beside the two anode lines 102-2. Thus, the size of the red light emitting pixels 102-1 can be maximized.

Second Embodiment

FIG. 8A to FIG. 8L are a plan view for showing a process for manufacturing a full color organic EL display device according to the second embodiment of the invention.

Figure 8A:
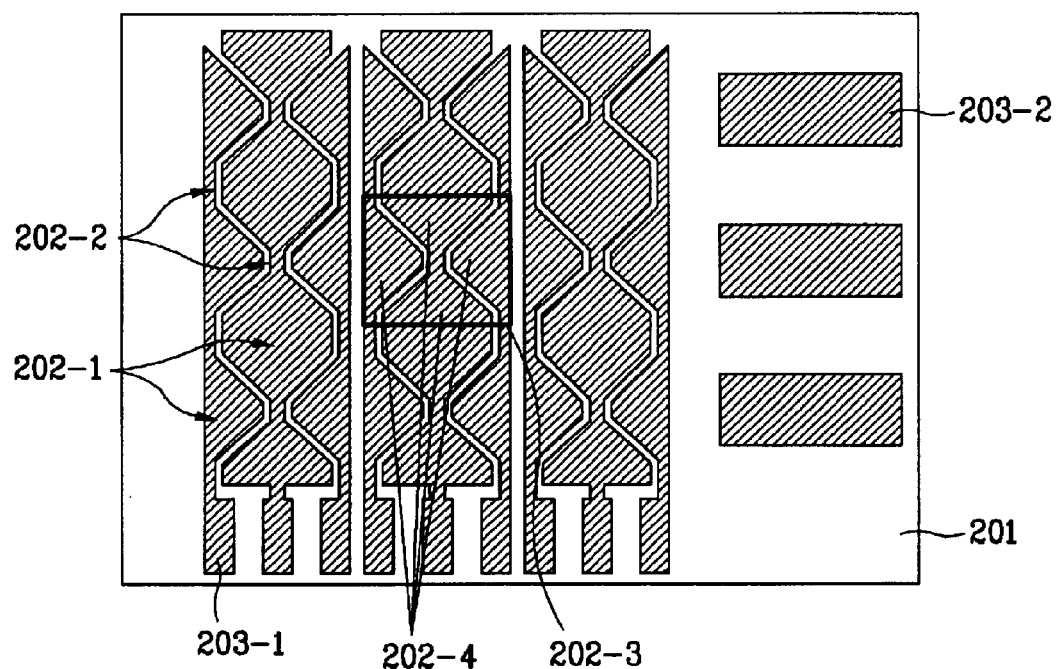
FIG. 8A to FIG. 8L are plan view for showing a process for manufacturing a full color organic EL display device according to the second embodiment of the invention.

First, as shown in FIG. 8A, patterns of anode lines 202-1 and 202-2 are formed on a glass 201 with ITO or other transparent electrodes. The anode lines 202-1 and 202-2 are patterned into the above shape so that each unit of light emitting pixels 202-3 is divided along diagonal directions into four sub-pixels 202-4 shaped as a triangle with smooth corners. The unit light emitting pixel 202-3 comprised of the sub-pixels 202-4 is provided with light emitting material layers for emitting red, green and blue lights.

In the sub-pixels 202-4 structured as above, a pair of sub-pixels opposed in the diagonal direction applied with red light emitting material layers which will emit low red lights with relatively low luminous efficiency, and another pair of sub-pixels are applied with blue and green light emitting material layers to emit blue and green lights.

Figure 8B:
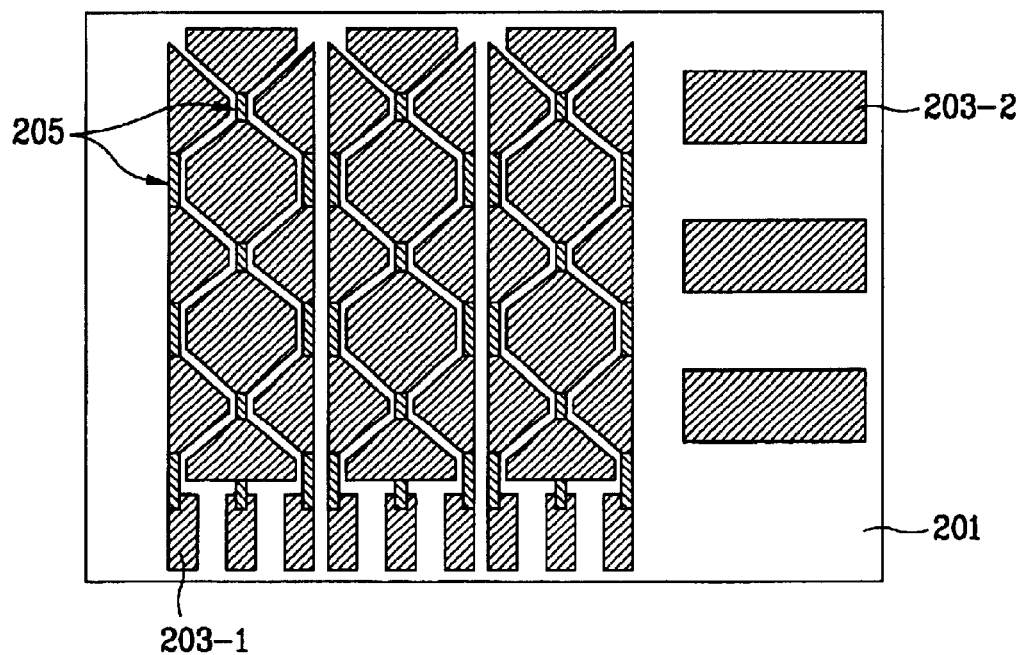

Then, as shown in FIG. 8B, auxiliary electrodes 205 are formed to reduce the resistance of the anode lines 202-2 at portions connecting the light emitting pixel.

Figure 8C:
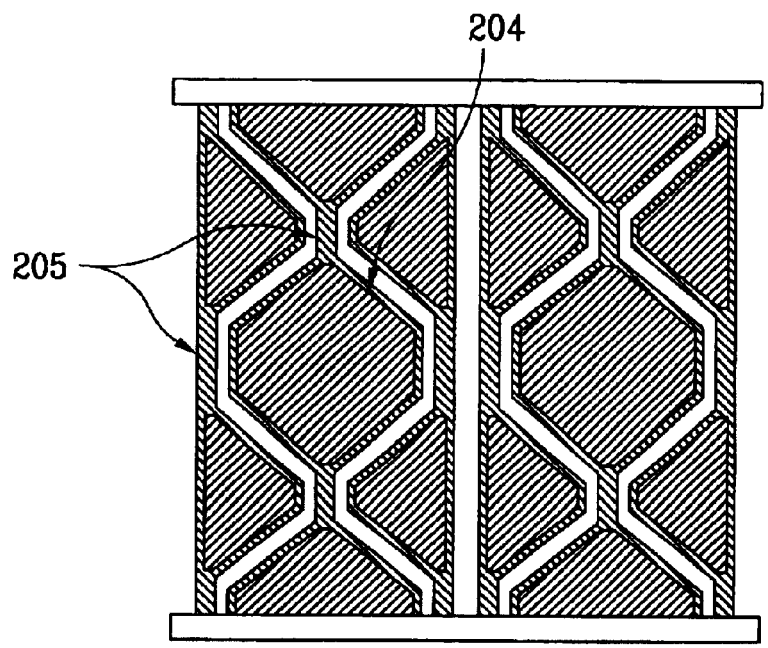

In sequence, as shown in FIG. 8C, when edge portions of each of the light emitting pixels are provided with auxiliary electrodes 204 also, the resistance can be further reduced compared to when the auxiliary electrodes are provided only in the anode lines 202-2 for connecting between each of the light emitting pixels.

Materials available for the auxiliary electrodes 204 and 205 include metals such as Cr, Al, Cu, W, Au, Ni, Ag and the like which have relatively small resistance than ITO.

Figure 8D:
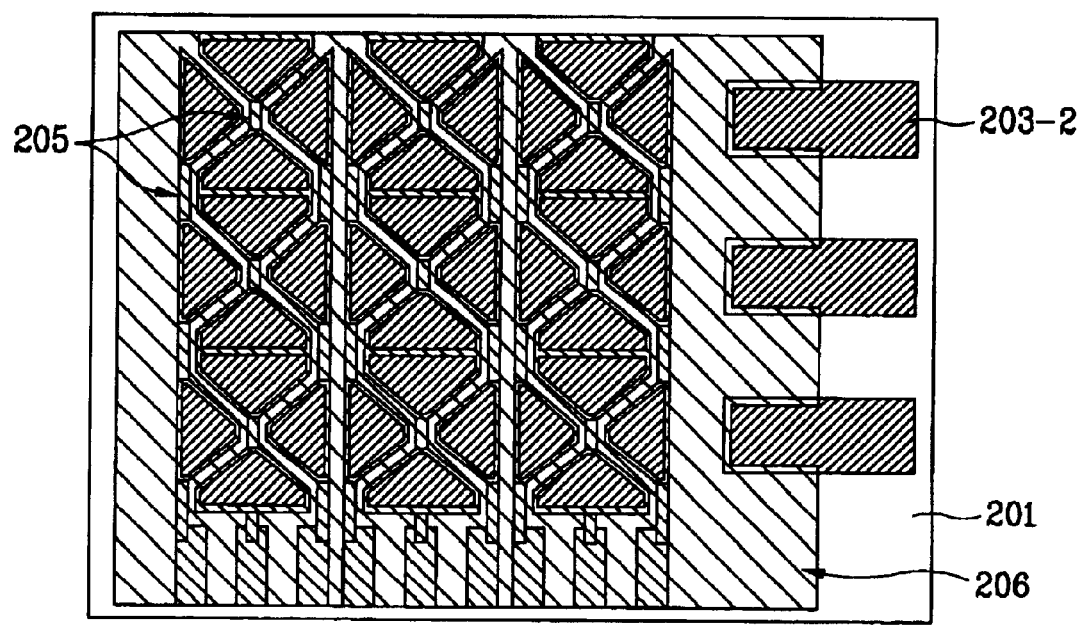

As shown in FIG. 8D, an insulating layer 206 is formed to cover anode taps 203-1.

The insulating layer 206 can be halved by using the red light emitting sub-pixels.

The insulating layer is formed around the light emitting pixels including the anode taps 203-1 where light is not emitted. The insulating layer 206 is made of an organic or inorganic insulator. The inorganic insulator includes oxide, nitride. Also, those spinably molten to solvents are available also. Polymers are preferred for the organic substance, and photo-resist, polyimide and polyolenfin are more preferred.

Figure 8E:
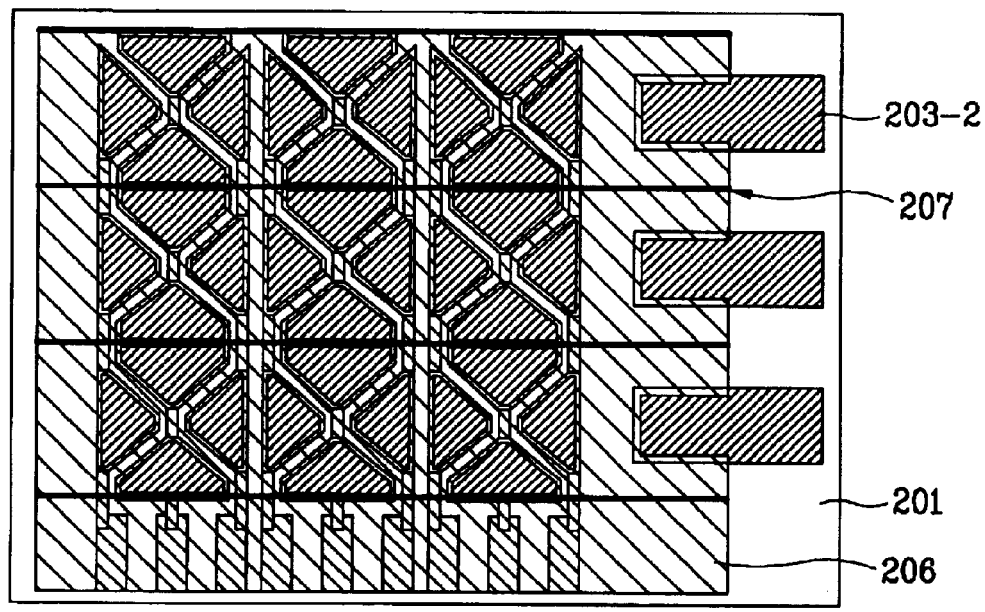

Then, as shown in FIG. 8E, insulating partitions 207 are formed for the insulation among cathodes which will be formed later.

Figure 8F:
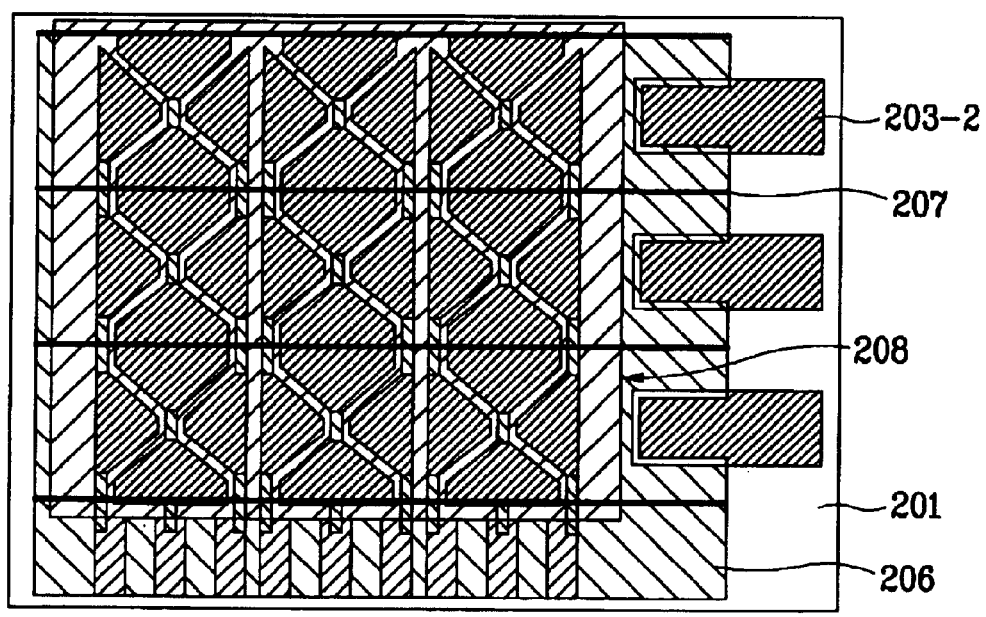

Next, as shown in FIG. 8F, red, green and blue common organic EL layers or common organic EL layers 208 are deposited at a single time by using a blank mask capable of performing deposition on the whole light emitting area.

Figure 8G:
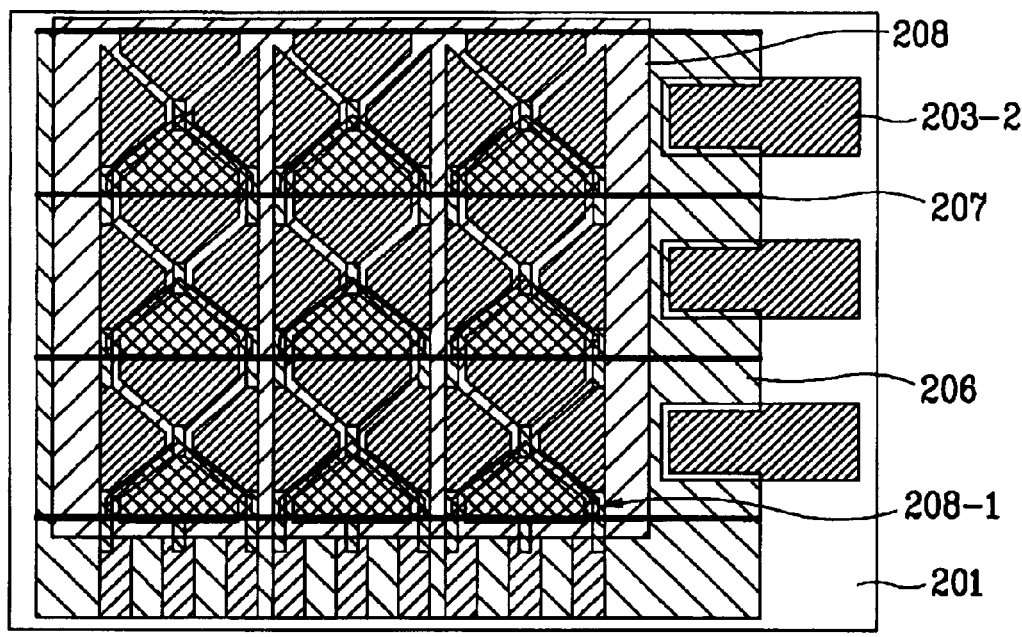
Figure 8H:
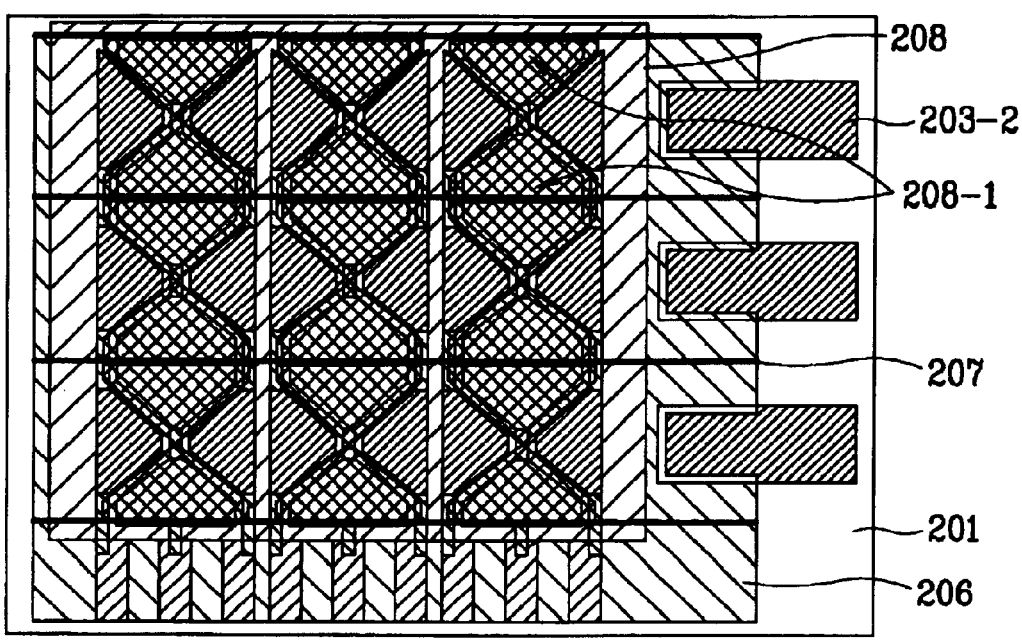
Figure 9:
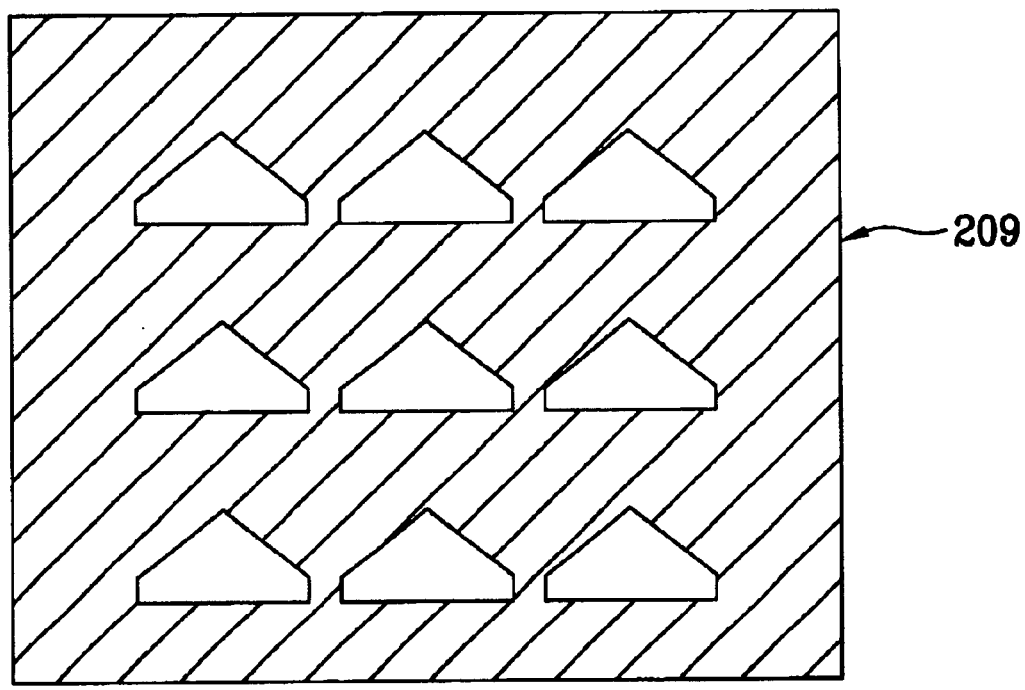
FIG. 9 shows a shadow mask according to the second embodiment of the invention.

Then, a shadow mask 209 shown in FIG. 9 is used to deposit red light emitting material layers 208-1 which are organic EL layers for emitting the red lights as shown in FIG. 8G and FIG. 8H. In forming light emitting pixels arranged in the upper part as shown in FIG. 8H, the shadow mask 209 is rotated 180°. Alternatively, a shadow mask having triangular holes formed in the upper and lower parts can be used also.

Figure 8I:
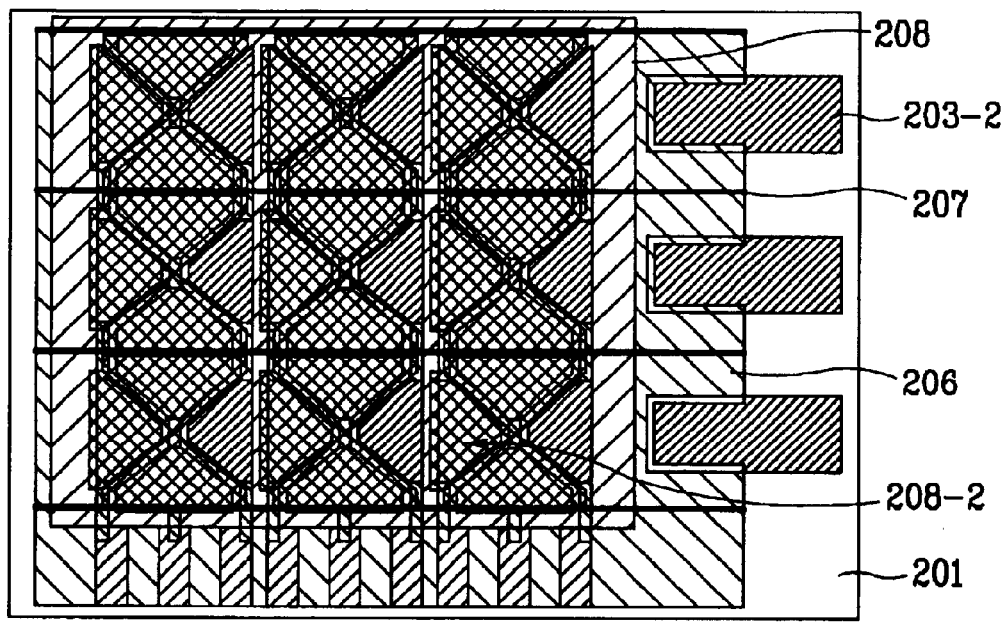
Figure 8J:
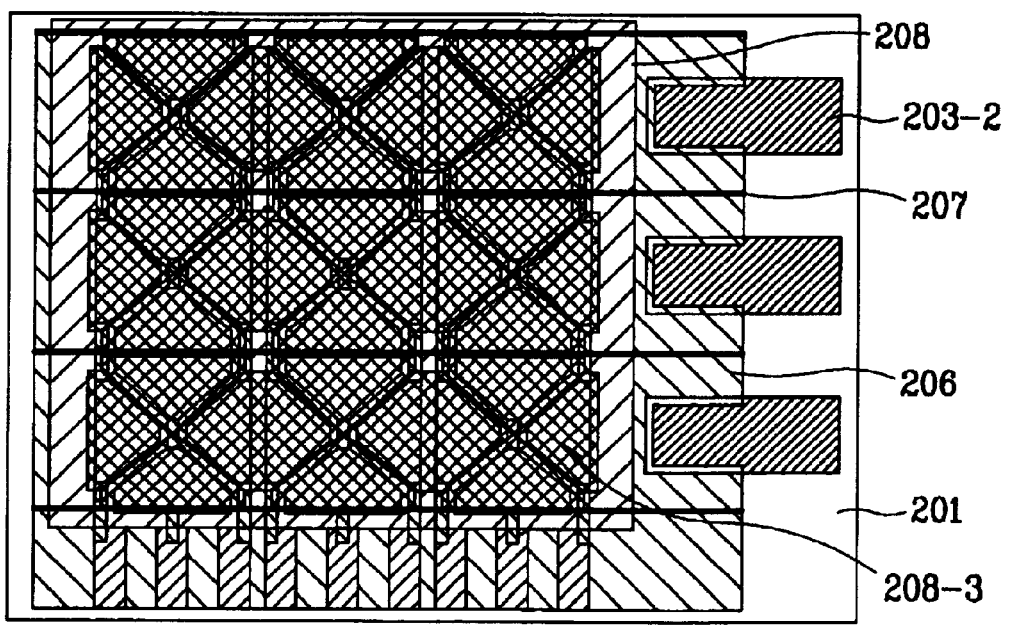

Then, in the same manner as in the red light emitting material layers, the shadow mask 209 is used to deposit green and blue light emitting material layers 208-2 and 208-3 for generating green and blue lights shown in FIG. 8I and FIG. 8J. Each of the light emitting material layers 208-2 and 208-3 is formed in each of the green and blue sub-pixels by rotating the shadow mask 209 or using another mask.

Here, instead of depositing the common organic EL layers 208 in the whole light emitting area, the common organic EL layers 208 can be formed in each of the RGB sub-pixels by using the single shadow mask 109 shown in FIG. 9.

Figure 8K:
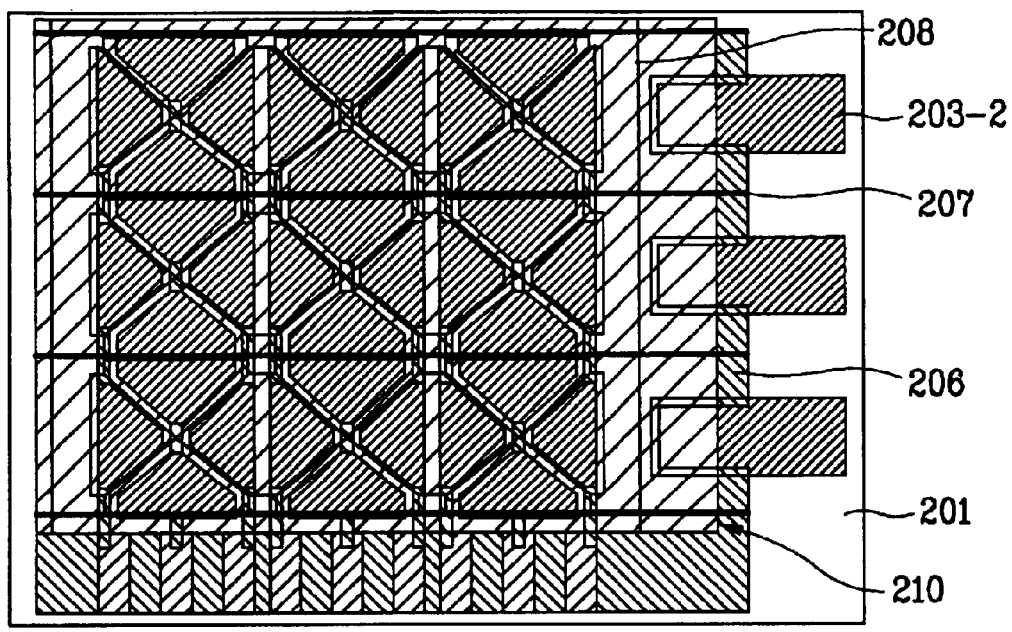

Then, as shown in FIG. 8K, a metal layer for forming the cathode lines 210 is formed by using a Mg—Ag alloy, Al or other conductive materials.

Figure 8L:
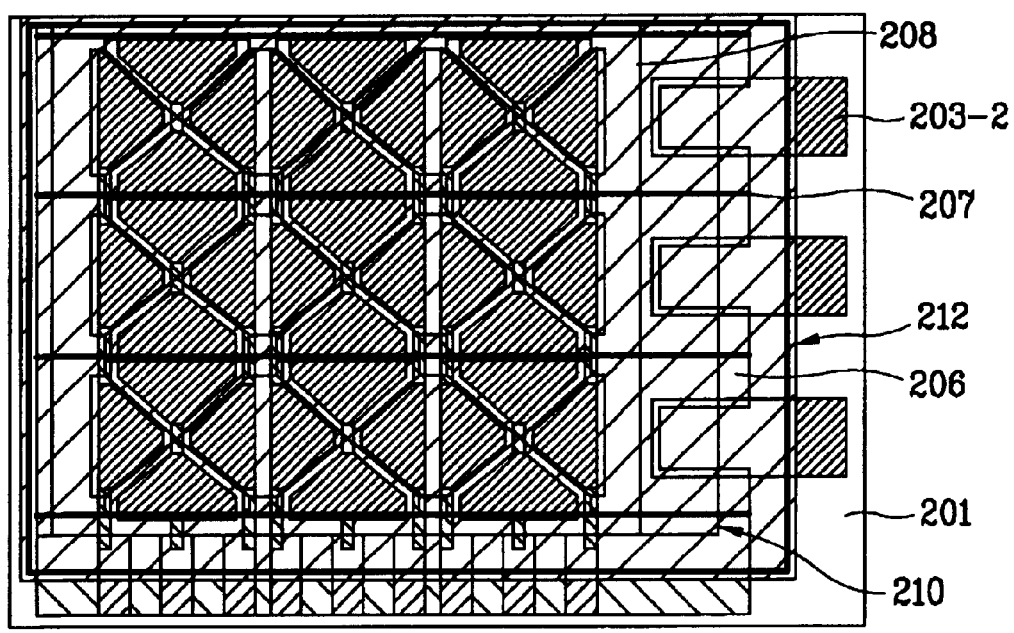

Then, as shown in FIG. 8L, a protective layer such as an oxygen absorbing layer, a moisture absorbing layer and a moisture proof cover is formed, and encapsulation is performed by using encapsulating materials 211 and encapsulating plates 212 to complete the device.

Third Embodiment

Figure 10:
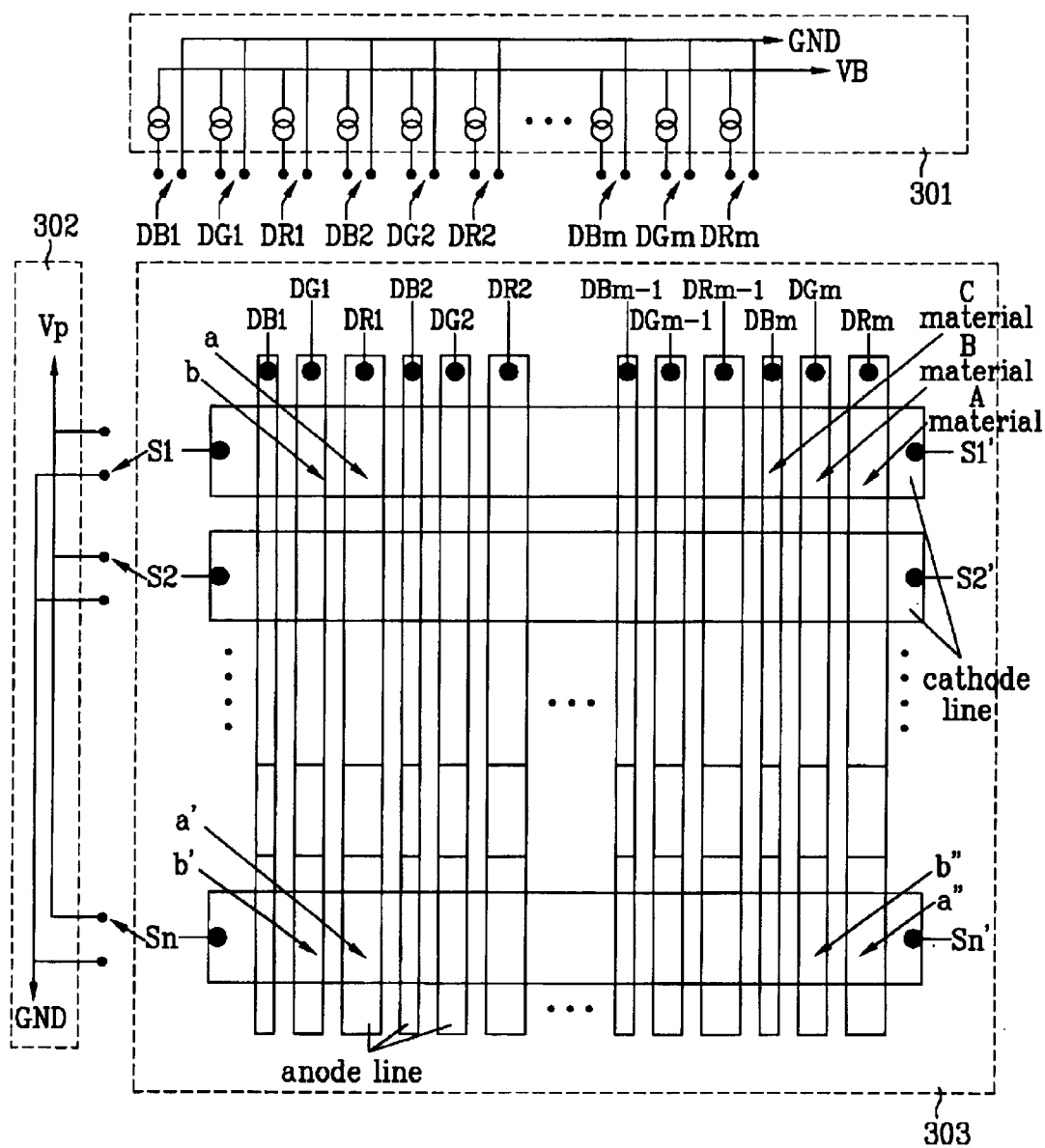
FIG. 10 shows a driving circuit of an RGB device having an array structure according to the third embodiment of the invention.

FIG. 10 shows a driving circuit for an organic EL device having an array structure according to the third embodiment of the invention.

Referring to FIG. 10, the driving circuit is comprised of an anode circuit 301 for applying a certain drive voltage to each of light emitting RGB pixels, a cathode circuit 302 for outputting scan signals to the cathode lines with both ends of cathode lines being connected in a circuit, and a display unit 303 for being displayed by data signals and the scan signals through the adjustment of the area ratio of each of the RGB light emitting pixels and the width of the anode lines according to the features of a drive voltage applied to each of the light emitting RGB pixels.

Figure 1:
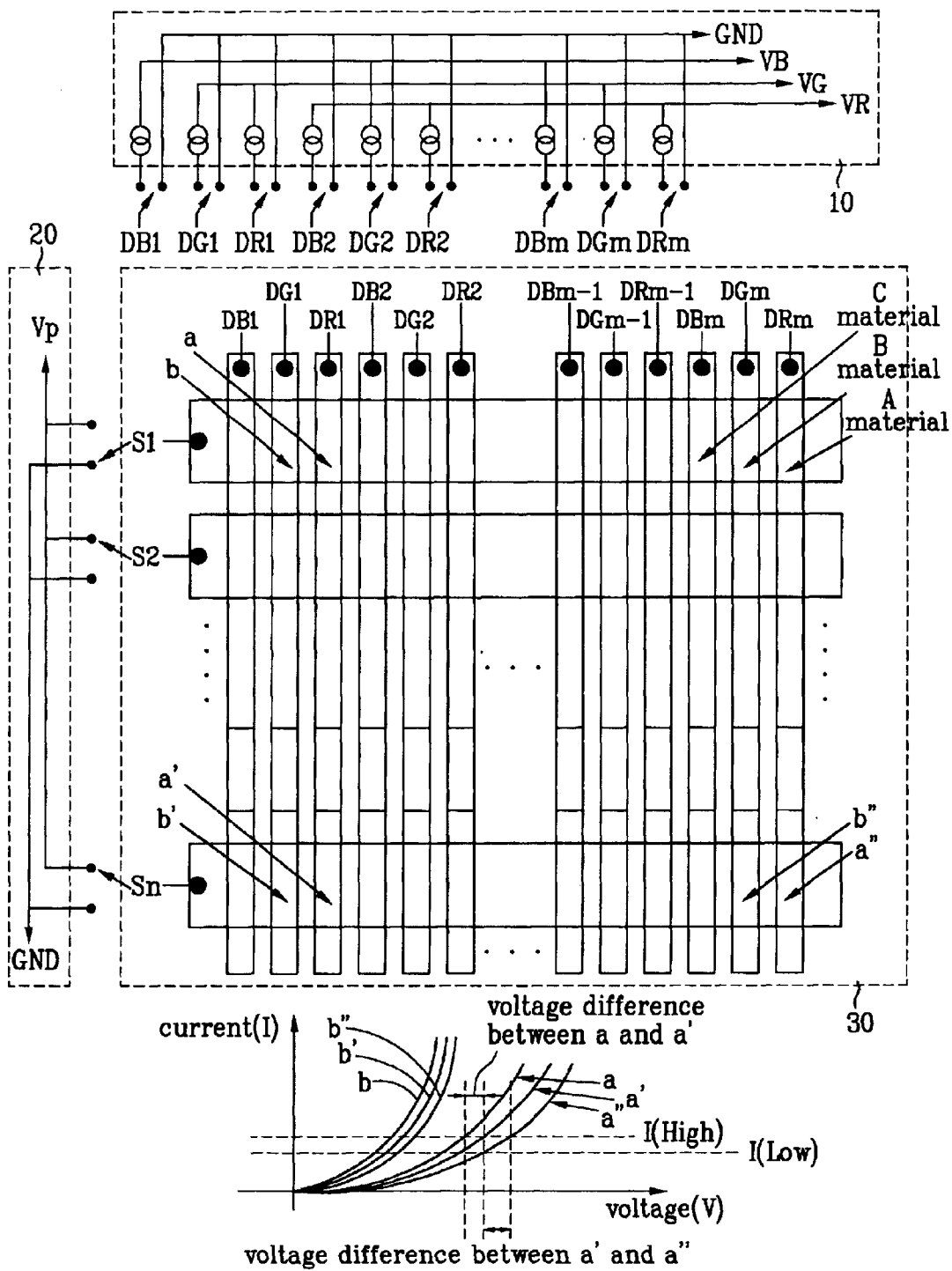
FIG. 1 shows a driving circuit of a device having a stripe-type array structure of the related art and the current v. voltage features of the circuit according to light emitting position.
Figure 2A:
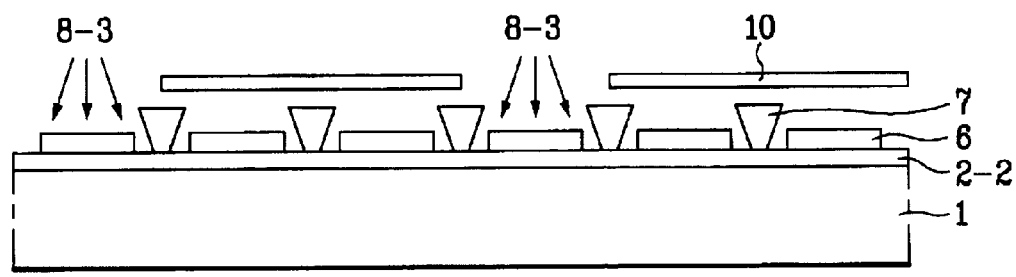
FIG. 2A is a sectional view of a full color organic EL display device.
Figure 2B:
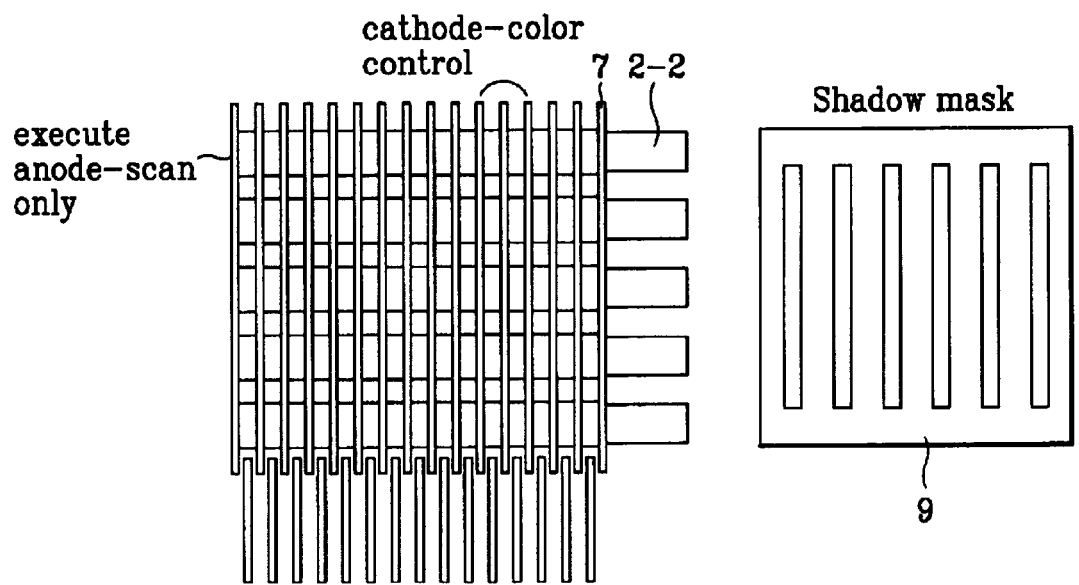
FIG. 2B is a plan view for showing a structure of an organic display device by using a line method of the related art.

Hereinafter, the current driven organic EL device of the invention as shown in FIG. 10 will be compared with the EL device of the related art as shown in FIG. 1.

If the different value of drive voltage is outputted from the anode circuit 10 for each of the RGB pixels as in the circuit of the related art in FIG. 1, power consumption can be reduced a little since it should be considered only about power consumption according to the supply voltage of each of the RGB pixels.

In this case, however, when the reverse voltage is applied for preventing crosstalk which can occur due to the properties of the organic EL device, the reverse voltage should be based upon the A material with the highest drive voltage so that the voltage applied to the A material in the array structure may not exceed threshold voltage. Thus, as a problem, the higher the drive voltage of the A material, the higher reverse voltage is required.

Therefore, the circuit of the invention, as shown in FIG. 10, can adjust the area ratio of each of the RGB light emitting pixels and the width of the anode lines for emitting a white light under each of the drive voltages which are as similar as possible so that the overall maximum drive voltage can be lowered to reduce power consumption and the reverse voltage for preventing crosstalk can be lowered also.

To be more specific, if the A material requires the highest voltage for emitting the white light, the area of the A light emitting pixels is enlarged to lower the drive voltage of the A material thereby reducing the overall drive voltage.

Also, as the area is increased and thus the line width of the A material is increased at the cathode side, the line resistance is reduced and thus the voltage applied to the anode line resistance is reduced also.

Meanwhile, other materials have better current v. voltage features than the A material and thus require less amount of current for emitting the white light. so, the area can be reduced and the voltage loss in line resistance can be reduced.

The area ratio of each of the RGB light emitting pixels and the width of the anode lines are adjusted like this, the line resistance and the drive voltage may be reduced.

Figure 11:
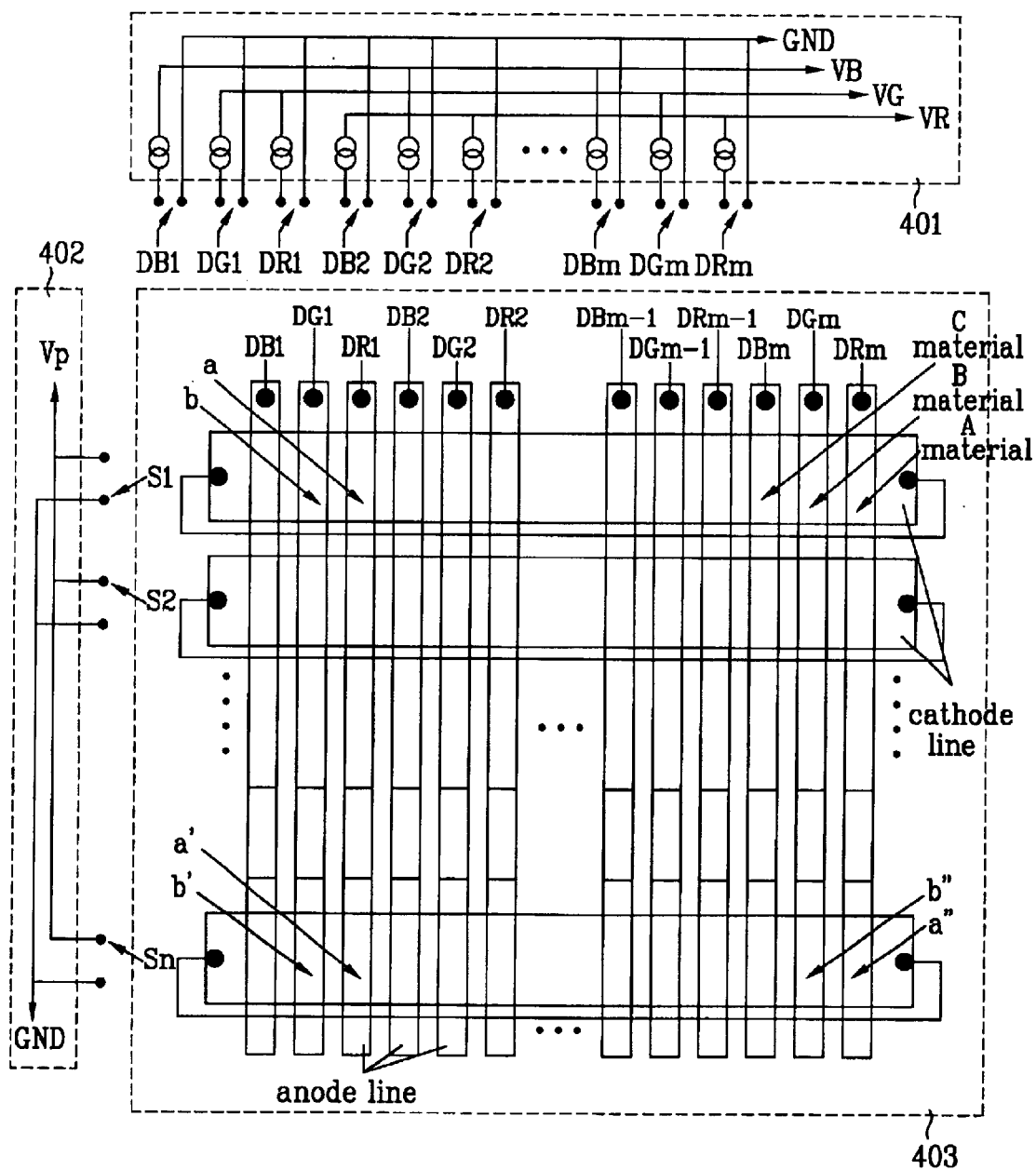
FIG. 11 shows a driving circuit for reducing a voltage applied to the line resistance of cathodes in the structure of FIG. 10.

FIG. 11 shows a driving circuit for reducing the voltage applied to the line resistance of the cathodes in the structure of FIG. 10.

Referring to FIG. 11, the driving circuit is comprised of an anode circuit 401 for outputting a different drive voltage for each of the RGB pixels so as to correspond to the drive voltage varying according to the line resistance and the material features of the anode lines and the cathode lines, a cathode circuit 402 having both ends of the cathode lines being connected for outputting the same signals to the both ends, and a display unit 403 composed of the RGB light emitting pixels with a certain size ratio and the anode lines and being displayed by applied data and scan signals.

Hereinafter, the current driven organic EL device of the invention as shown in FIG. 11 will be compared with the EL device of the related art as shown in FIG. 1.

According to the array structure of the related art shown in FIG. 1, the current of each of the RGB pixels, which flows through the anodes of the light emitting pixels, flows through the cathodes incurring voltage step-up due to the line resistance of cathodes.

When the light emitting pixels need larger amount of current to obtain higher luminance, the magnitude of voltage applied to the cathode line resistance will increase more.

Here, if one cathode line is connected with the cathode circuit 20 at only one terminal, one cathode line adjacently connected with the cathode circuit 20 and another cathode line remotely connected with the cathode circuit 20 have line resistance different from each other.

In other words, the line resistance applied to portions of the RGB light emitting pixels remote from the cathode circuit 20 is enlarged.

In order to solve such problems, one end of each of the cathode lines is bound with the other end in driving the circuit, the voltage applied to the cathode line resistance can be halved.

In other words, the voltage is the highest in the center of each of the cathode lines and lowers as approaches the both ends thereof. So, comparing with the circuit as shown in FIG. 1 where the current flows from one end of each of the cathode lines to the other end thereof, the voltage applied to the line resistance of the cathode lines shown in FIG. 11 can be halved if the same current flows through the cathode lines in FIG. 11 and those in FIG. 1.

Figure 12:
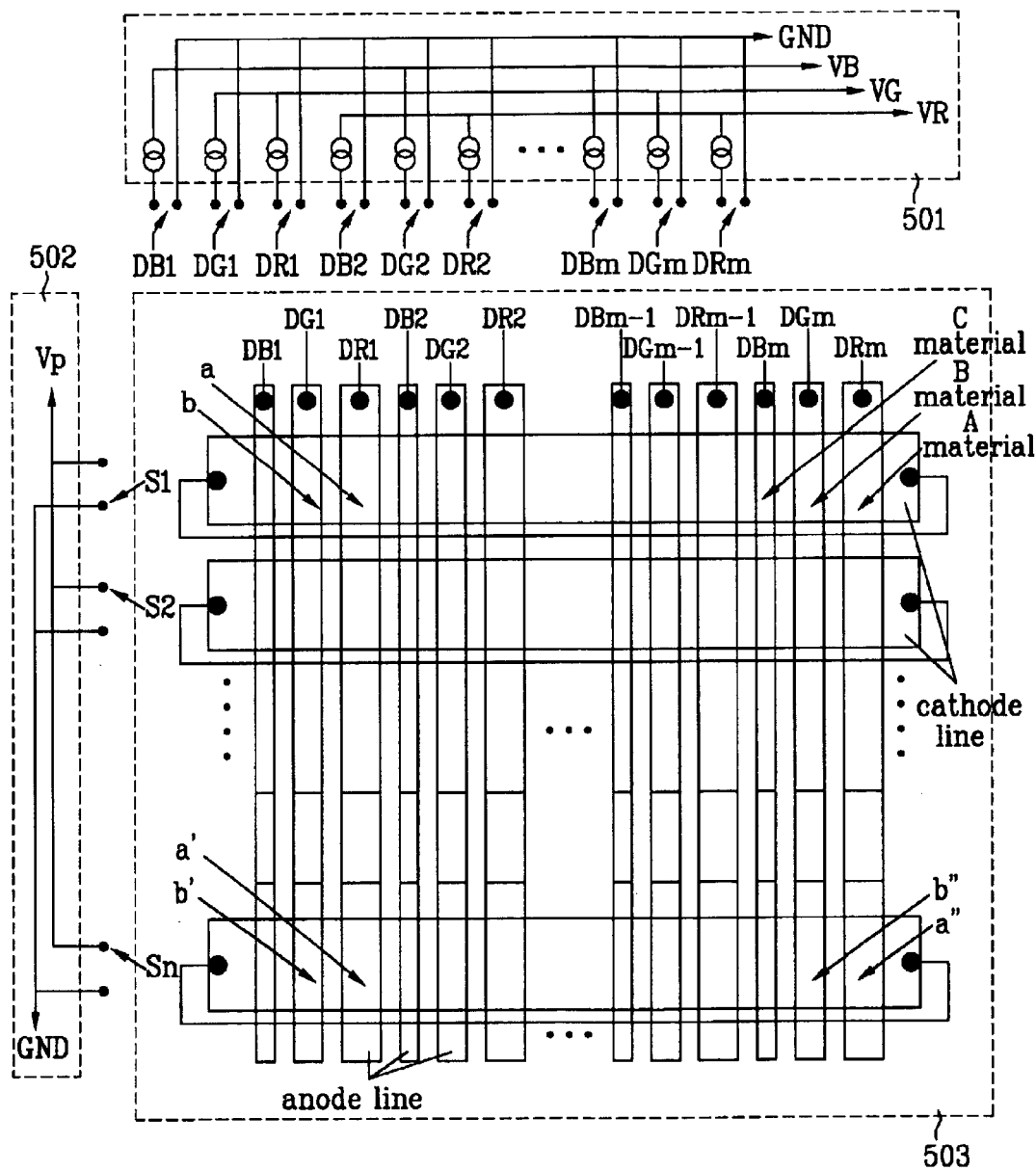
FIG. 12 shows a driving circuit for reducing power consumption by reducing a voltage applied to the line resistance of cathodes in the structure of FIG. 10.

FIG. 12 shows a driving circuit in which both ends of each of cathode lines are bound as in FIG. 11 to prevent the voltage step-up shown in the structure of FIG. 10. The circuit is comprised of an anode circuit 501 for outputting a different drive voltage for each of the RGB pixels so as to correspond to the drive voltage varying according to the line resistance and the material features of the anode lines and the cathode lines, a cathode circuit 502 for outputting scan signals to the cathode lines with both ends connected in a circuit, and a display unit 503 for being displayed by data signals and the scan signals through the adjustment of the area ratio of each of the RGB light emitting pixels and the width of the anode lines according to the features of a drive voltage applied to each of the light emitting RGB pixels.

Figure 13:
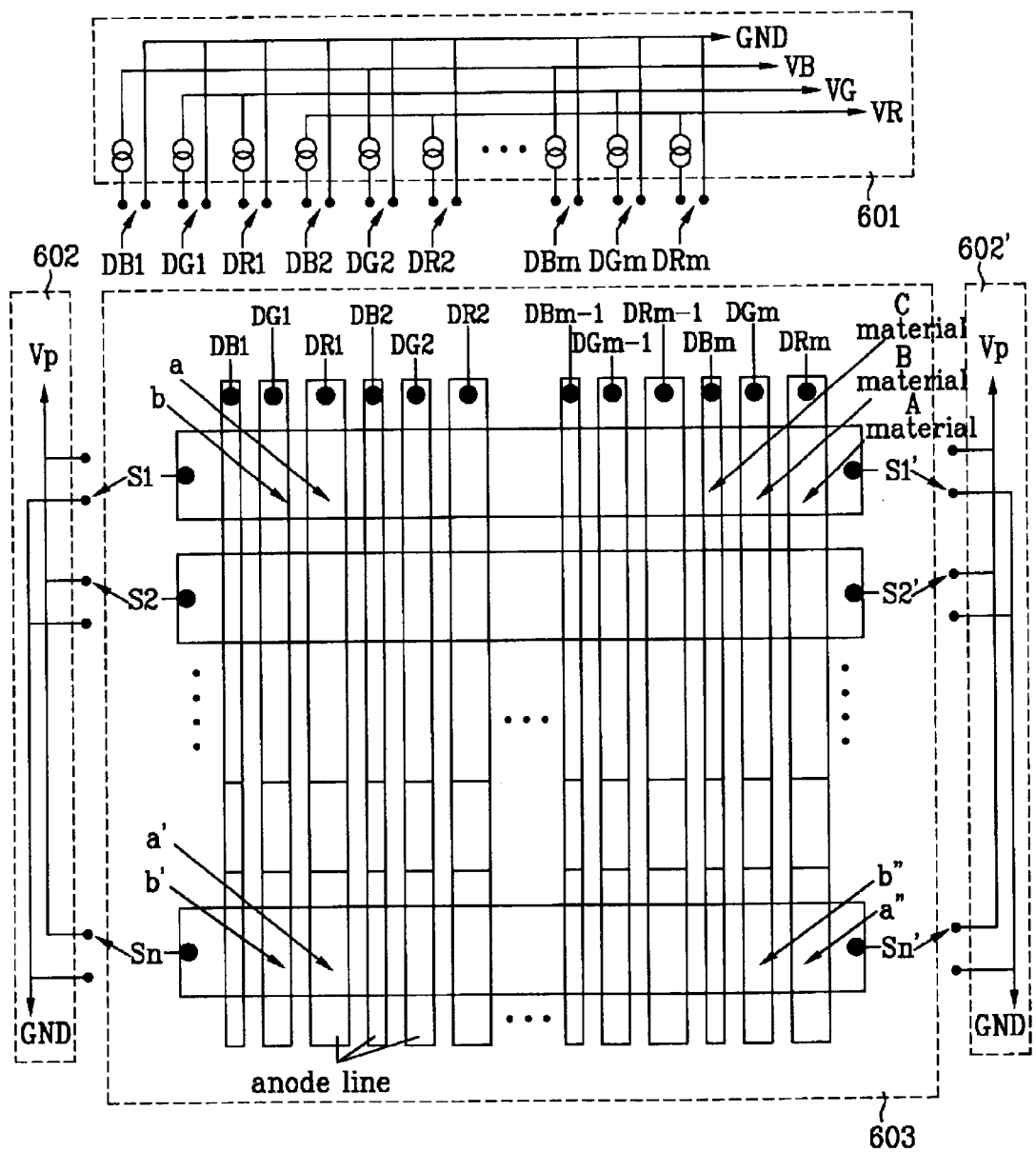
FIG. 13 shows alternative embodiment of the driving circuit shown in FIG. 12.

FIG. 13 shows a driving circuit according to another embodiment of the invention. The driving circuit is comprised of an anode circuit 601 for outputting a different drive voltage for each of the RGB pixels so as to correspond to the drive voltage varying according to the line resistance and the material features of the anode lines and the cathode lines, cathode circuits 602 and 602' arranged at both ends of cathode lines for outputting scan signals to the both ends of the cathode lines, and a display unit 603 for being displayed by data signals and the scan signals through the adjustment of the area ratio of each of the RGB light emitting pixels and the width of the anode lines according to the features of a drive voltage applied to each of the light emitting RGB pixels.

Considering the difference between FIG. 13 and FIG. 12, the both ends of the cathode lines are bound in applying the scan signals to the both ends of the cathode lines in FIG. 12, and the two cathode circuits are provided to apply the scan signals to the both ends of the cathode lines thereby preventing the voltage step-up due to the current in the cathode lines in FIG. 13.

Since specific features of FIG. 12 and FIG. 13 can be understood through the description of FIG. 10 and FIG. 11, the specific description thereof will be omitted.

Meanwhile, the driving circuits of the organic EL device shown in FIG. 10 to FIG. 13 can be adopted to all types of display devices which are powered with electricity.

As described hereinbefore, the full color organic EL display device, the manufacturing method thereof, and the driving circuit of the organic EL display device of the invention have the following effects:

First, in manufacturing the full color organic EL device, in order to compensate the disadvantage of the red light emitting pixels with the relatively lower luminous efficiency, the red light emitting pixels are sized larger than the green light emitting pixels and the blue light emitting pixels to enhance the luminous efficiency of the red light emitting pixels. Thus, the texture and the opening ratio can be enhanced to raise the efficiency of the device.

Second, the single shadow mask can be used in depositing the RGB organic EL layers.

Third, the auxiliary electrodes with low resistance are provided in certain portions of the cathode stripes to reduce resistance so that the uniformity across the screen can be enhanced and the drive voltage of the device can be reduced.

Fourth, the influence from the line resistance in the anode lines and the cathode lines is reduced when a constant current is introduced into the device structured of the RGB array in order to realize the white light as full color. Thus, the voltage loss on the line resistance is prevented and the area ratio of the device is adjusted to make each of the RGB pixels for generating the white light have the similar value of drive voltage thereby minimizing power loss.

Throughout the foregoing description, those skilled in the art will appreciate that various modifications, additions and substitutions are possible, without departing from the scope and spirit of the invention. Therefore, the technical scope of the invention is not restricted to the description of the foregoing embodiments but will be defined those disclosed in the accompanying claims.

What is claimed is:

1. A full color organic EL display panel comprising:
   a plurality of light emitting pixels, wherein each of the plurality of light emitting pixels comprise a light emitting material;
   a plurality of transparent anode electrodes arranged on a first side of the plurality of light emitting pixels;
   at least one auxiliary electrode formed on at least one anode electrode thereby forming at least one anode/auxiliary electrode combination with a lower resistivity than the anode electrode alone;
   a plurality of cathode electrodes arranged on a side of the plurality of light emitting pixels opposite the anode electrodes;
   wherein the light emitting material of at least one light emitting pixel has a surface area that is different than surface areas of the light emitting material of other light emitting pixels to compensate for differences in luminous efficiency among the light emitting pixels.

2. A full color organic EL display panel according to claim 1, wherein the plurality of light emitting pixels comprise a plurality of red, green and blue light emitting pixel sets, and wherein at least two of the light emitting pixels in each light emitting pixel set are arranged colinearly with each other, and the third light emitting pixel in each set is arranged on one side of the two colinearly arranged light emitting pixels.

3. A full color organic EL display panel according to claim 2, the two colinearly arranged light emitting pixels in each light emitting pixel set comprise light emitting material with a smaller surface area than the light emitting material of the third light emitting pixel in the light emitting pixel set.

4. A full color organic EL display panel according to claim 1, wherein the at least one auxiliary electrode extends around at least one light emitting pixel.

5. A full color organic EL display panel according to claim 1, wherein the anode electrodes comprise quandrangular structures so as to not overlap with the light emitting pixels.

6. A full color organic EL display panel according to claim 1, wherein at least one of the red, green and blue light emitting pixels in each light emitting pixel set has a quadrangular structure.

7. A full color organic EL display panel according to claim 1, wherein said red, green and blue light emitting pixels in each light emitting pixel set are arranged in a delta structure.

8. The full color organic EL display panel according to claim 1, wherein the plurality of light emitting pixels comprise a plurality of red, green and blue light emitting pixel sets, and wherein one of said red, green and blue light emitting pixels in each light emitting pixel set comprise first and second sub-pixels opposed along one direction and the other two light emitting pixels in each light emitting pixel set comprise third and fourth sub-pixels, respectively, opposed along another direction.

* * * * *